United States Patent
Lee et al.

(10) Patent No.: US 10,916,202 B2
(45) Date of Patent: Feb. 9, 2021

(54) HIGH VOLTAGE SENSING CIRCUIT, DISPLAY DRIVER INTEGRATED CIRCUIT AND DISPLAY APPARATUS INCLUDING THE SAME

(71) Applicant: Samsung Electronics Co., Ltd., Suwon-si (KR)

(72) Inventors: Kyung-Hoon Lee, Suwon-si (KR); Sang-Pil Nam, Pohang-si (KR); Sang-Heon Lee, Seoul (KR); Michael Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/420,688

(22) Filed: May 23, 2019

(65) Prior Publication Data

US 2020/0193913 A1 Jun. 18, 2020

(30) Foreign Application Priority Data

Dec. 12, 2018 (KR) ........................ 10-2018-0159800

(51) Int. Cl.
*G09G 3/3275* (2016.01)
*G09G 3/3266* (2016.01)
(Continued)

(52) U.S. Cl.
CPC ....... *G09G 3/3275* (2013.01); *G01R 19/0046* (2013.01); *G09G 3/3266* (2013.01);
(Continued)

(58) Field of Classification Search
CPC ... G09G 2300/0852; G09G 2310/0254; G09G 2320/0295; G09G 2320/043; G09G 3/3233; G09G 3/3275
See application file for complete search history.

(56) References Cited

U.S. PATENT DOCUMENTS 8,446,345 B2 5/2013 Yu et al.
8,907,703 B1 12/2014 Trampitsch
(Continued)

FOREIGN PATENT DOCUMENTS

KR  2011-0146978    7/2013
KR  20170064168 A   6/2017

*Primary Examiner* — Chun-Nan Lin
(74) *Attorney, Agent, or Firm* — Harness, Dickey & Pierce, P.L.C.

(57) ABSTRACT

A high voltage sensing circuit included in a display driver integrated circuit includes a plurality of channels, a plurality of sampling capacitors, an amplifier and a feedback capacitor. The plurality of channels receives a plurality of input voltages. The plurality of sampling capacitors are connected to the plurality of channels, respectively, to simultaneously sample the plurality of input voltages. The amplifier is configured to sequentially receive each of a plurality of sampled input voltages to sequentially generate a respective plurality of sensing voltages. The feedback capacitor is connected between an input terminal and an output terminal of the amplifier, and is shared by the plurality of channels. The amplifier and the feedback capacitor are configured such that each of the plurality of sampled input voltages is sequentially scaled to the respective one of the plurality of sensing voltages by the amplifier and the feedback capacitor.

18 Claims, 14 Drawing Sheets

(51) Int. Cl.
  *G01R 19/00* (2006.01)
  *G09G 3/3233* (2016.01)
  *H03F 3/45* (2006.01)
  *H03F 1/34* (2006.01)
  *H03F 3/04* (2006.01)

(52) U.S. Cl.
  CPC ... *G09G 3/3233* (2013.01); *G09G 2310/0291* (2013.01); *G09G 2310/0294* (2013.01); *G09G 2320/0233* (2013.01); *G09G 2320/045* (2013.01); *G09G 2330/08* (2013.01); *H03F 1/34* (2013.01); *H03F 3/04* (2013.01); *H03F 3/45071* (2013.01); *H03F 2200/129* (2013.01); *H03F 2200/156* (2013.01); *H03F 2203/45116* (2013.01); *H03F 2203/45514* (2013.01)

(56) References Cited

U.S. PATENT DOCUMENTS

| | | | |
|---|---|---|---|
| 9,355,584 B2 | 5/2016 | Chaji et al. | |
| 9,521,342 B2 | 12/2016 | Mesgarani | |
| 9,620,053 B2 | 4/2017 | Kim et al. | |
| 2010/0085282 A1* | 4/2010 | Yu | G09G 3/3233 345/76 |
| 2014/0368415 A1* | 12/2014 | Kim | G09G 3/3208 345/77 |
| 2018/0240403 A1 | 8/2018 | Wang et al. | |

* cited by examiner

HIGH VOLTAGE SENSING CIRCUIT, DISPLAY DRIVER INTEGRATED CIRCUIT AND DISPLAY APPARATUS INCLUDING THE SAME

CROSS-REFERENCE TO RELATED APPLICATION

This application claims priority under 35 USC § 119 to Korean Patent Application No. 10-2018-0159800, filed on Dec. 12, 2018 in the Korean Intellectual Property Office (KIPO), the contents of which are herein incorporated by reference in their entirety.

BACKGROUND

Example embodiments relate generally to semiconductor integrated circuits, and more particularly to high voltage sensing circuits, display driver integrated circuits including the high voltage sensing circuits, and display apparatuses including the display driver integrated circuits. In general, a display apparatus includes a display panel for displaying an image, and a display driving circuit for driving the display panel.

SUMMARY

At least one example embodiment of the present disclosure provides a high voltage sensing circuit capable of efficiently sensing a relatively high voltage while consuming less power and occupying less area in a chip.

At least one example embodiment of the present disclosure provides a display driver integrated circuit including the high voltage sensing circuit.

At least one example embodiment of the present disclosure provides a display apparatus including the display driver integrated circuit.

According to example embodiments, a high voltage sensing circuit is included in a display driver integrated circuit. The display driver integrated circuit including a plurality of channels, a plurality of sampling capacitors, an amplifier, and a feedback capacitor. The plurality of channels are configured to receive a plurality of input voltages, respectively. The plurality of sampling capacitors are connected to the plurality of channels, respectively, to simultaneously sample respective ones of the plurality of input voltages. The amplifier is configured to sequentially receive each of a plurality of sampled input voltages to sequentially generate a respective plurality of sensing voltages, each of the respective plurality of sensing voltages being lower than a respective one of the plurality of input voltages. The feedback capacitor is connected between an input terminal and an output terminal of the amplifier, and shared by the plurality of channels. The amplifier and the feedback capacitor are configured such that each of the plurality of sampled input voltages is sequentially scaled to the respective one of the plurality of sensing voltages by the amplifier and the feedback capacitor.

According to example embodiments, a display driver integrated circuit includes a gate driver, a data driver and a high voltage sensing circuit. The gate driver configured to selectively enable a plurality of gate lines of a display panel. The data driver is configured to apply a plurality of driving voltages to a plurality of data lines of the display panel. The high voltage sensing circuit is configured to sense a plurality of input voltages provided from the display panel. The high voltage sensing circuit is configured to sense a plurality of input voltages provided from the display panel. The display driver integrated circuit including a plurality of channels, a plurality of sampling capacitors, an amplifier, and a feedback capacitor. The plurality of channels are configured to receive a plurality of input voltages, respectively. The plurality of sampling capacitors are connected to the plurality of channels, respectively, to simultaneously sample respective ones of the plurality of input voltages. The amplifier is configured to sequentially receive each of a plurality of sampled input voltages to sequentially generate a respective plurality of sensing voltages, each of the respective plurality of sensing voltages being lower than a respective one of the plurality of input voltages. The feedback capacitor is connected between an input terminal and an output terminal of the amplifier, and shared by the plurality of channels. The amplifier and the feedback capacitor are configured such that each of the plurality of sampled input voltages is sequentially scaled to the respective one of the plurality of sensing voltages by the amplifier and the feedback capacitor.

According to example embodiments, a display apparatus includes a display panel including a plurality of pixels connected to a plurality of gate lines and a plurality of data lines and a display driver integrated circuit. The display driver integrated circuit includes a gate driver, a data driver and a high voltage sensing circuit. The gate driver is configured to selectively enable the plurality of gate lines. The data driver is configured to apply a plurality of driving voltages to the plurality of data lines. The high voltage sensing circuit is configured to sense a plurality of input voltages provided from the display panel. The high voltage sensing circuit includes a plurality of channels, a plurality of sampling capacitors, an amplifier, and a feedback capacitor. The plurality of channels configured to receive the plurality of input voltages, respectively. The plurality of sampling capacitors are connected to the plurality of channels, respectively, the plurality of sampling capacitors are configured to simultaneously sample respective ones of the plurality of input voltages. The amplifier is configured to sequentially receive each of a plurality of sampled input voltages to sequentially generate a respective plurality of sensing voltages, each of the respective plurality of sensing voltages being lower than a respective one of the plurality of input voltages. The feedback capacitor is connected between an input terminal and an output terminal of the amplifier and shared by the plurality of channels. The amplifier and the feedback capacitor are configured such that each of the plurality of sampled input voltages is sequentially scaled to the respective one of the plurality of sensing voltages by the amplifier and the feedback capacitor.

Accordingly, the high voltage sensing circuit, the display driver integrated circuit, and the display apparatus according to example embodiments may include the feedback capacitor that is shared by the plurality of channels regardless of the number of the plurality of channels, and thus the high voltages received from the plurality of channels may be efficiently sensed or detected without increasing the number of capacitors and increasing the circuit area. As the feedback capacitor is commonly used by all the channels, only mismatching of the sampling capacitor needs to be considered to minimize mismatching between the channels, and thus the sensing error may be reduced and the sensing accuracy and performance may be improved. In addition, the scaling operation and the holding operation may be substantially simultaneously performed using the amplifier and the feedback capacitor. Since the sensing operation is performed including only a two-phase operation of the sampling interval and the holding interval, the sensing speed may be improved.

Further, the switch structure for preventing damage to the holding and scaling unit, which is a low voltage circuit, may be added to the high voltage sensing circuit, and thus the high voltage sensing circuit may have improved or enhanced reliability.

BRIEF DESCRIPTION OF THE DRAWINGS

Illustrative, non-limiting example embodiments will be more clearly understood from the following detailed description taken in conjunction with the accompanying drawings.

DETAILED DESCRIPTION

Figure 1:
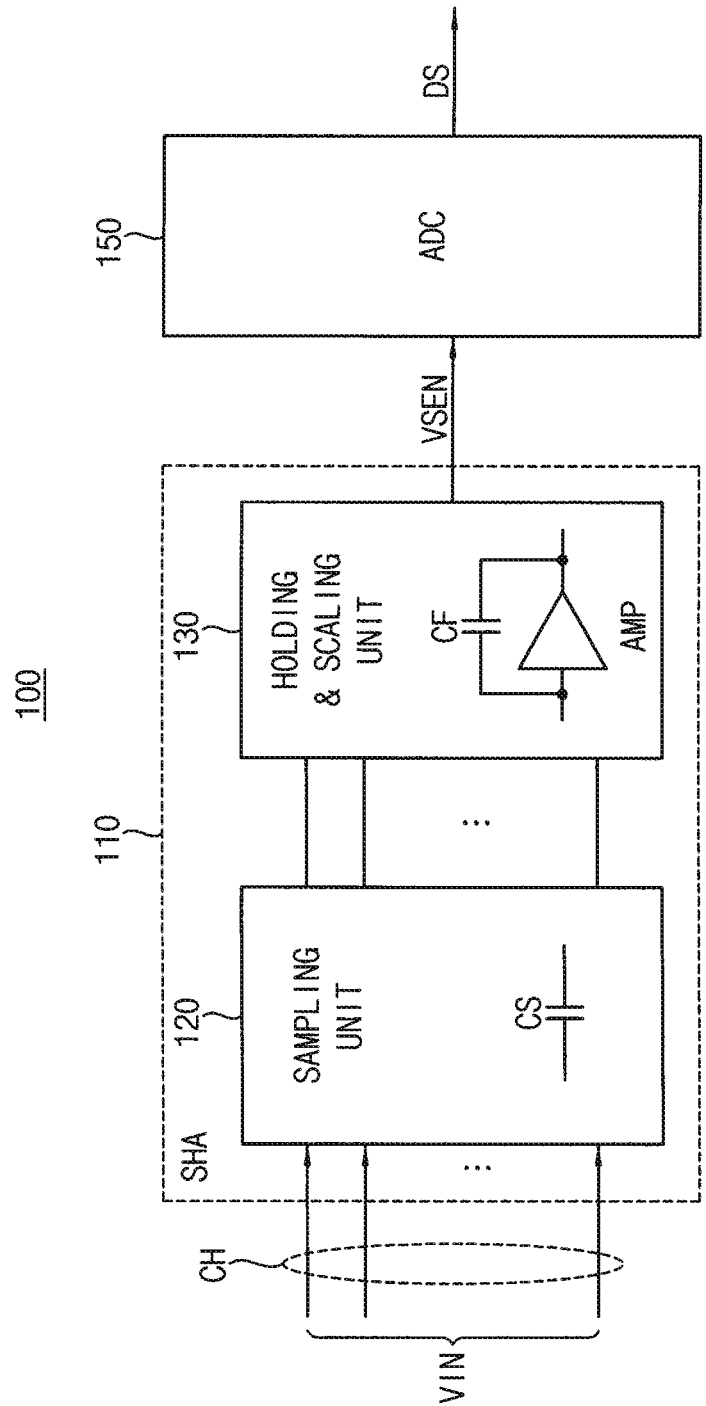
FIG. 1 is a block diagram illustrating a high voltage sensing circuit according to some example embodiments.

Various example embodiments will be described more fully with reference to the accompanying drawings, in which embodiments are shown. The present disclosure may, however, be embodied in many different forms and should not be construed as limited to example embodiments set forth herein. Like reference numerals refer to like elements throughout this application.

FIG. 1 is a block diagram illustrating a high voltage sensing circuit according to example embodiments.

Referring to FIG. 1, a high voltage sensing circuit 100 includes a plurality of channels CH, and a sample-and-hold amplifier (SHA) 110. The high voltage sensing circuit 100 may further include an analog-to-digital converter (ADC) 150.

The high voltage sensing circuit 100 is included in a display driver integrated circuit for driving a display apparatus. Detailed configurations of the display driver integrated circuit and the display apparatus will be described with reference to FIGS. 11 through 13.

The plurality of channels CH receives a plurality of input voltages VIN. For example, each of the plurality of input voltages VIN may be a high voltage having a voltage level higher than that of a driving voltage used to drive the high voltage sensing circuit 100. As will be described with reference to FIG. 11, the plurality of input voltages VIN may be provided from a display panel included in the display apparatus.

The sample-and-hold amplifier 110 performs a sampling operation and a holding operation based on the plurality of input voltages VIN to generate a plurality of sensing voltages VSEN. For example, each of the plurality of sensing voltages VSEN may be a low voltage having a voltage level lower than that of each of the plurality of input voltages VIN and similar to that of the driving voltage used to drive the high voltage sensing circuit 100.

The sample-and-hold amplifier 110 may include a sampling unit 120, and a holding and scaling unit 130.

The sampling unit 120 may perform the sampling operation on the plurality of input voltages VIN, and may include a plurality of sampling capacitors CS. The plurality of sampling capacitors CS may be connected to the plurality of channels CH, respectively, to simultaneously or concurrently sample the plurality of input voltages VIN. For example, the number of the plurality of sampling capacitors CS may be substantially equal to the number of the plurality of channels CH.

The holding and scaling unit 130 may perform the holding operation and a scaling operation on outputs of the sampling unit 120 (e.g., a plurality of sampled input voltages), and may generate the plurality of sensing voltages VSEN. As will be described with reference to FIG. 4, the holding operation and the scaling operation may be substantially simultaneously or concurrently performed.

The holding and scaling unit 130 may include an amplifier AMP, and a feedback capacitor CF. The amplifier AMP may sequentially receive the plurality of sampled input voltages to sequentially generate the plurality of sensing voltages VSEN. Restated, the amplifier AMP is configured to sequentially receive each of a plurality of sampled input voltages to sequentially generate a respective plurality of sensing voltages VSEN, each of the respective plurality of sensing voltages VSEN being lower than a respective one of the plurality of input voltages. The feedback capacitor CF may be connected between an input terminal and an output terminal of the amplifier AMP, and may be shared by the plurality of channels CH. The plurality of sampled input voltages may be sequentially scaled to the plurality of sensing voltages VSEN by the amplifier AMP and the feedback capacitor CF. Restated, the amplifier AMP and the feedback capacitor CF are configured such that each of the plurality of sampled input voltages is sequentially scaled to the respective one of the plurality of sensing voltages VSEN by the amplifier AMP and the feedback capacitor CF.

In some example embodiments, the scaling operation may be a down-scaling operation for reducing a voltage level. For example, the plurality of input voltages VIN which are high voltages may be down-scaled to the plurality of sensing voltages VSEN which are low voltages by a gain G. The gain G may be expressed by Equation 1.

$$G = CS/CF \quad \text{[Equation 1]}$$

To perform the down-scaling operation, a capacitance of the feedback capacitor CF may be greater than a capacitance of the sampling capacitor CS.

The analog-to-digital converter 150 may perform an analog-to-digital conversion operation for converting the plurality of sensing voltages VSEN to a plurality of digital signals DS.

Figure 2:
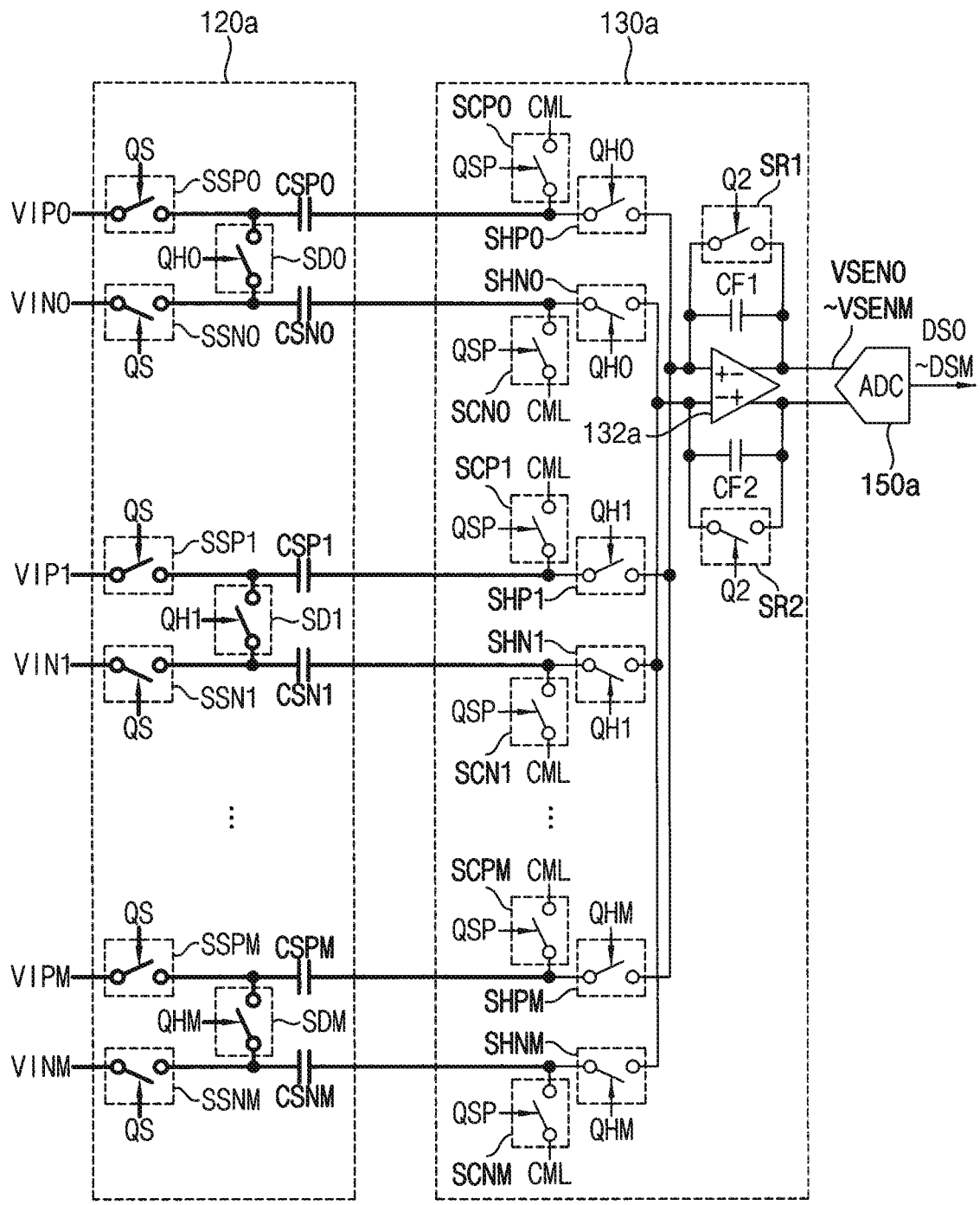
FIG. 2 is a circuit diagram illustrating an example of the high voltage sensing circuit of FIG. 1.

FIG. 2 is a circuit diagram illustrating an example of the high voltage sensing circuit of FIG. 1.

Referring to FIG. 2, a sampling unit 120a, a holding and scaling unit 130a, and an analog-to-digital converter 150a included in the high voltage sensing circuit 100 of FIG. 1 are illustrated in FIG. 2.

The sampling unit 120a may receive a plurality of input voltages VIP0, VIN0, VIP1, VIN1, . . . , VIPM and VINM from a plurality of channels.

In an example of FIG. 2, the plurality of channels may be implemented in a differential scheme or manner. For example, two signal lines receiving a pair of input voltages (e.g., the input voltages VIP0 and VIN0) may form one channel. One of the pair of input voltages (e.g., the input voltage VIP0) may be an input voltage which is a high voltage actually provided from the display panel, and the other of the pair of input voltages may be a reference voltage for implementing the differential scheme. Although FIG. 2 illustrates (M+1) channels for convenience of illustration, where M is a natural number greater than or equal to two, the number of channels may be changed according to example embodiments.

The sampling unit 120a may include a plurality of sampling capacitors CSP0, CSN0, CSP1, CSN1, . . . , CSPM and CSNM, and may further include a plurality of sampling switches SSP0, SSN0, SSP1, SSN1, . . . , SSPM and SSNM, and a plurality of differential switches SD0, SD1, . . . , SDM.

The plurality of sampling capacitors CSP0, CSN0, CSP1, CSN1, . . . , CSPM and CSNM may be connected to the plurality of channels. For example, the sampling capacitors CSP0 and CSN0 may be connected to a first channel receiving the input voltages VIP0 and VIN0, the sampling capacitors CSP1 and CSN1 may be connected to a second channel receiving the input voltages VIP1 and VIN1, and the sampling capacitors CSPM and CSNM may be connected to a (M+1)-th channel receiving the input voltages VIPM and VINM.

The plurality of sampling switches SSP0, SSN0, SSP1, SSN1, . . . , SSPM and SSNM may be disposed or located between the plurality of channels and the plurality of sampling capacitors CSP0, CSN0, CSP1, CSN1, . . . , CSPM and CSNM, and may operate in response to a first sampling signal QS. For example, the sampling switches SSP0 and SSN0 may be disposed between the first channel and the sampling capacitors CSP0 and CSN0, the sampling switches SSP1 and SSN1 may be disposed between the second channel and the sampling capacitors CSP1 and CSN1, and the sampling switches SSPM and SSNM may be disposed between the (M+1)-th channel and the sampling capacitors CSPM and CSNM.

As will be described with reference to FIG. 4, the plurality of sampling switches SSP0, SSN0, SSP1, SSN1, . . . , SSPM and SSNM may be substantially simultaneously turned on in response to the first sampling signal QS such that the plurality of input voltages VIP0, VIN0, VIP1, VIN1, . . . , VIPM and VINM are substantially simultaneously sampled by the plurality of sampling capacitors CSP0, CSN0, CSP1, CSN1, . . . , CSPM and CSNM.

The plurality of differential switches SD0, SD1, . . . , SDM may be disposed or located between the plurality of sampling switches SSP0, SSN0, SSP1, SSN1, . . . , SSPM and SSNM and between the plurality of sampling capacitors CSP0, CSN0, CSP1, CSN1, . . . , CSPM and CSNM, and may operate in response to a plurality of holding signals QH0, QH1, . . . , QHM. For example, the differential switch SD0 may be disposed between the sampling switches SSP0 and SSN0 and between the sampling capacitors CSP0 and CSN0, and may operate in response to the first holding signal QH0. The differential switch SD1 may be disposed between the sampling switches SSP1 and SSN1 and between the sampling capacitors CSP1 and CSN1, and may operate in response to the second holding signal QH1. The differential switch SDM may be disposed between the sampling switches SSPM and SSNM and between the sampling capacitors CSPM and CSNM, and may operate in response to the (M+1)-th holding signal QHM.

The holding and scaling unit 130a may include an amplifier 132a, and feedback capacitors CF1 and CF2, and may further include a plurality of holding switches SHP0, SHN0, SHP1, SHN1, . . . , SHPM and SHNM, a plurality of common mode switches SCP0, SCN0, SCP1, SCN1, . . . , SCPM and SCNM, and reset switches SR1 and SR2.

The amplifier 132a may sequentially receive a plurality of sampled input voltages that are sampled by the plurality of sampling capacitors CSP0, CSN0, CSP1, CSN1, . . . , CSPM and CSNM to sequentially generate a plurality of sensing voltages VSEN0~VSENM.

In an example of FIG. 2, the amplifier 132a may also be implemented in the differential scheme. For example, the amplifier 132a may include two input terminals and two output terminals. One of the two input terminals may be selectively connected to one signal line group (e.g., signal lines receiving the input voltages VIP0, VIP1, . . . , VIPM) included in the plurality of channels, and the other of the two input terminals may be selectively connected to the other signal line group (e.g., signal lines receiving the input voltages VIN0, VIN1, . . . , VINM) included in the plurality of channels. The two output terminals may sequentially output the plurality of sensing voltages VSEN0~VSENM which are differential signals.

The feedback capacitors CF1 and CF2 may be connected between input and output of the amplifier 132a. For example, the feedback capacitor CF1 may be connected between the first input terminal and the first output terminal of the amplifier 132a, and the feedback capacitor CF2 may be connected between the second input terminal and the second output terminal of the amplifier 132a. The feedback capacitors CF1 and CF2 may be shared by the plurality of channels.

The reset switches SR1 and SR2 may be connected in parallel with the feedback capacitors CF1 and CF2 between the input and output of the amplifier 132a, and may operate in response to a reset signal Q2. For example, the reset switch SR1 may be connected in parallel with the feedback capacitor CF1 between the first input terminal and the first output terminal of the amplifier 132a, and the reset switch SR2 may be connected in parallel with the feedback capacitor CF2 between the second input terminal and the second output terminal of the amplifier 132a.

The plurality of holding switches SHP0, SHN0, SHP1, SHN1, . . . , SHPM and SHNM may be disposed or located between the plurality of sampling capacitors CSP0, CSN0, CSP1, CSN1, . . . , CSPM and CSNM and the amplifier 132a, and may operate in response to the plurality of holding signals QH0, QH1, . . . , QHM. For example, the holding switches SHP0 and SHN0 may be disposed between the sampling capacitors CSP0 and CSN0 and the amplifier 132a, and may operate in response to the first holding signal QH0. The holding switches SHP1 and SHN1 may be disposed between the sampling capacitors CSP1 and CSN1 and the amplifier 132a, and may operate in response to the second holding signal QH1. The holding switches SHPM and SHNM may be disposed between the sampling capacitors CSPM and CSNM and the amplifier 132a, and may operate in response to the (M+1)-th holding signal QHM.

As will be described with reference to FIG. 4, the plurality of holding switches SHP0, SHN0, SHP1, SHN1, ..., SHPM and SHNM may be sequentially turned on in response to the plurality of holding signals QH0, QH1, ..., QHM such that the plurality of sampled input voltages are sequentially scaled to the plurality of sensing voltages VSEN0~VSENM by the amplifier 132a and the feedback capacitors CF1 and CF2.

The plurality of common mode switches SCP0, SCN0, SCP1, SCN1, ..., SCPM and SCNM may selectively connect a common mode voltage CML to nodes between the plurality of sampling capacitors CSP0, CSN0, CSP1, CSN1, ..., CSPM and CSNM and the plurality of holding switches SHP0, SHN0, SHP1, SHN1, ..., SHPM and SHNM in response to a second sampling signal QSP. For example, the common mode switches SCP0 and SCN0 may selectively connect the common mode voltage CML to the nodes between the sampling capacitors CSP0 and CSN0 and the holding switches SHP0 and SHN0 in response to the second sampling signal QSP. The common mode switches SCP1 and SCN1 may selectively connect the common mode voltage CML to the nodes between the sampling capacitors CSP1 and CSN1 and the holding switches SHP1 and SHN1 in response to the second sampling signal QSP. The common mode switches SCPM and SCNM may selectively connect the common mode voltage CML to the nodes between the sampling capacitors CSPM and CSNM and the holding switches SHPM and SHNM in response to the second sampling signal QSP.

The analog-to-digital converter 150a may convert the plurality of sensing voltages VSEN0~VSENM into a plurality of digital signals DS0~DSM. In an example of FIG. 2, the analog-to-digital converter 150a may also be implemented in the differential scheme.

As described above, all of the plurality of channels, the amplifier 132a and the analog-to-digital converter 150a may be implemented in the differential scheme. Thus, the plurality of channels and the amplifier 132a may be connected to each other in the differential scheme, and the amplifier 132a and the analog-to-digital converter 150a may be connected to each other in the differential scheme.

In some example embodiments, the sampling unit 120a may include or may be implemented with elements or devices for a high voltage, and the holding and scaling unit 130a may include or may be implemented with elements or devices for a low voltage.

For example, since the plurality of input voltages VIP0, VIN0, VIP1, VIN1, ..., VIPM and VINM are high voltages which have relatively high voltage levels, the plurality of sampling switches SSP0, SSN0, SSP1, SSN1, ..., SSPM and SSNM and the plurality of differential switches SD0, SD1, ..., SDM that are included in the sampling unit 120a may include switching elements for a high voltage that are capable of enduring or withstanding the high voltage (e.g., that are not damaged by the high voltage). For example, the switching element for the high voltage may include a high voltage transistor having a relatively high threshold voltage. In addition, the plurality of sampling capacitors CSP0, CSN0, CSP1, CSN1, ..., CSPM and CSNM that are included in the sampling unit 120a may include capacitors for the high voltage that are capable of enduring or withstanding the high voltage. In FIG. 2 and subsequent figures, the elements or devices for the high voltage are illustrated by a relatively thick solid line.

Since the holding and scaling unit 130a operates using low voltages which have relatively low voltage levels, the plurality of holding switches SHP0, SHN0, SHP1, SHN1, ..., SHPM and SHNM, the plurality of common mode switches SCP0, SCN0, SCP1, SCN1, ..., SCPM and SCNM, the reset switches SR1 and SR2 and the amplifier 132a that are included in the holding and scaling unit 130a may include switching elements for a low voltage. For example, the switching element for the low voltage may include a low voltage transistor having a relatively low threshold voltage. In addition, the feedback capacitors CF1 and CF2 included in the holding and scaling unit 130a may include capacitors for the low voltage. In FIG. 2 and subsequent figures, the elements or devices for the low voltage are illustrated by a relatively thin solid line.

Although not illustrated in FIG. 2, the analog-to-digital converter 150a may also include or may also be implemented with the elements or devices for the low voltage.

Figure 3:
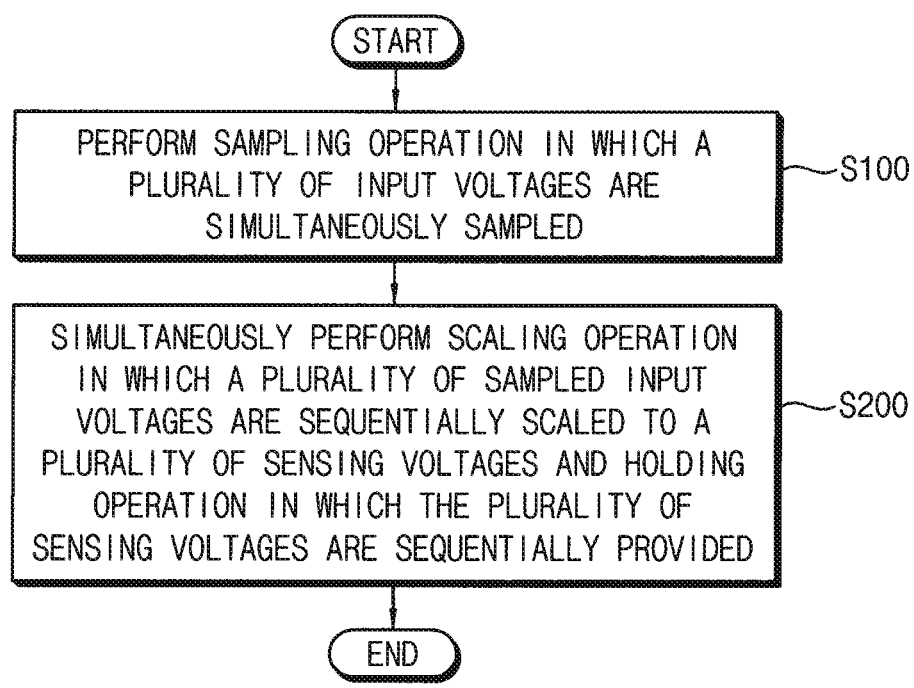
FIG. 3 is a flowchart illustrating a method of operating a high voltage sensing circuit according to some example embodiments.

FIG. 3 is a flowchart illustrating a method of operating a high voltage sensing circuit according to example embodiments. FIG. 4 is a timing diagram illustrating an operation of the high voltage sensing circuit of FIG. 2 based on the method of FIG. 3. In a timing diagram of FIG. 4, all of signals Q2, QS, QSP, QH0, QH1, ..., QHM may include an active period having a logic high level and an inactive period having a logic low level. Each switch operating in response to each signal may be turned on and closed in the active period, and may be turned off and opened in the inactive period.

Figure 4:
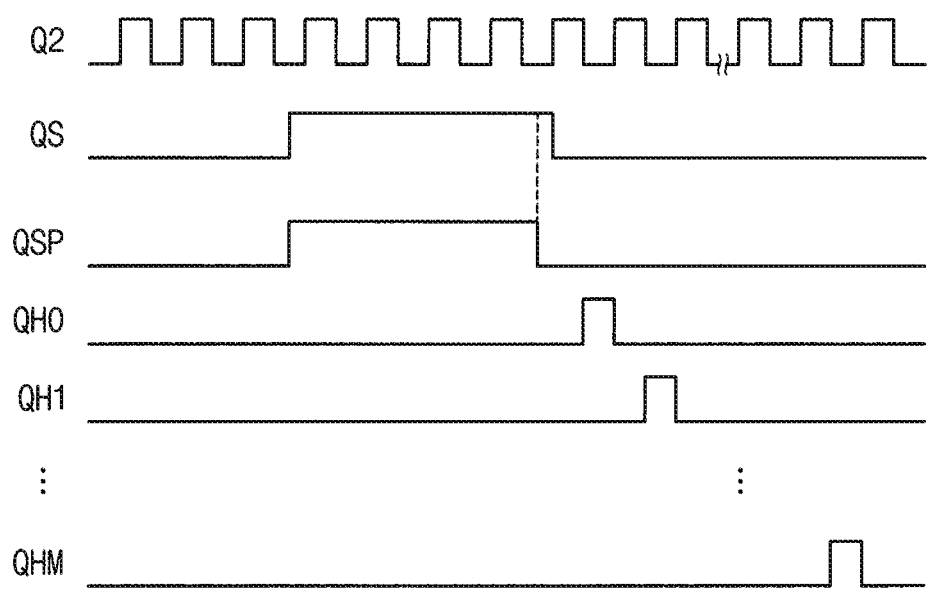
FIG. 4 is a timing diagram illustrating an operation of the high voltage sensing circuit of FIG. 2 based on the method of FIG. 3.

Referring to FIGS. 2, 3 and 4, in method of operating a high voltage sensing circuit according to example embodiments, a sampling operation in which a plurality of input voltages received from a plurality of channels are simultaneously sampled is performed using a plurality of sampling capacitors (step S100).

For example, as illustrated in FIG. 4, the reset signal Q2 may be regularly toggled such that an active period and an inactive period are alternately repeated. During a sampling interval, the first sampling signal QS may be activated, the plurality of sampling switches SSP0, SSN0, SSP1, SSN1, ..., SSPM and SSNM may be substantially simultaneously turned on, one ends of the plurality of sampling capacitors CSP0, CSN0, CSP1, CSN1, ..., CSPM and CSNM may be electrically connected to the plurality of channels, respectively, and thus the plurality of input voltages VIP0, VIN0, VIP1, VIN1, ..., VIPM and VINM received from the plurality of channels may be substantially simultaneously sampled by the plurality of sampling capacitors CSP0, CSN0, CSP1, CSN1, ..., CSPM and CSNM. Restated, the plurality of sampling switches SSP0, SSN0, SSP1, SSN1, ..., SSPM and SSNM are configured such that when the first sampling signal is received during a sampling interval the plurality of input voltages VIP0, VIN0, VIP1, VIN1, ..., VIPM are substantially simultaneously sampled by the plurality of sampling capacitors CSP0, CSN0, CSP1, CSN1, ..., CSPM and CSNM.

In addition, during the sampling interval, the second sampling signal QSP may be activated, the plurality of common mode switches SCP0, SCN0, SCP1, SCN1, ..., SCPM and SCNM may be substantially simultaneously turned on, and thus the common mode voltage CML may be provided at the other ends of the plurality of sampling capacitors CSP0, CSN0, CSP1, CSN1, ..., CSPM and CSNM.

In some example embodiments, the second sampling signal QSP may be activated simultaneously with the first sampling signal QS, and may be deactivated prior to the first sampling signal QS. In this case, the plurality of common mode switches SCP0, SCN0, SCP1, SCN1, . . . , SCPM and SCNM may turned off prior to the plurality of sampling switches SSP0, SSN0, SSP1, SSN1, . . . , SSPM and SSNM, and thus a charge injection problem which may occur at the sampling capacitors CSP0, CSN0, CSP1, CSN1, . . . , CSPM and CSNM when switching from the sampling operation to the holding operation may be prevented.

After the sampling operation is performed and completed, a scaling operation in which a plurality of sampled input voltages are sequentially scaled to a plurality of sensing voltages and a holding operation in which the plurality of sensing voltages are sequentially provided or output are simultaneously performed using an amplifier and a feedback capacitor (step S200).

For example, as illustrated in FIG. 4, during a holding interval subsequent to the sampling interval, the plurality of holding signals QH0, QH1, . . . , QHM are sequentially activated, the plurality of holding switches SHP0, SHN0, SHP1, SHN1, . . . , SHPM and SHNM and the plurality of differential switches SD0, SD1, . . . , SDM may be sequentially activated, and thus the plurality of sampled input voltages may be sequentially held and scaled. Restated, the plurality of holding switches SHP0, SHN0, SHP1, SHN1, . . . , SHPM and SHNM are configured such that when the plurality of holding signals QH0, QH1, . . . , QHM are sequentially received during a holding interval, each of the plurality of sampled input voltages is sequentially scaled to the respective one of the plurality of sensing voltages VSEN and the plurality of sensing voltages VSEN are sequentially provided, the plurality of sampled input voltages are sequentially scaled and the plurality of sensing voltages VSEN are sequentially provided simultaneously.

When the first holding signal QH0 is activated, the holding switches SHP0 and SHN0 and the differential switch SD0 may be turned on, one ends of the sampling capacitors CSP0 and CSN0 may be electrically connected to each other, and the other end of the sampling capacitors CSP0 and CSN0 may be electrically connected to the amplifier 132a. The scaling operation and the holding operation for the input voltages VIP0 and VIN0 that are received from the first channel and sampled may be substantially simultaneously performed by the amplifier 132a and the feedback capacitors CF1 and CF2 to generate the scaled-down sensing signal VSEN0. In this case, the feedback capacitors CF1 and CF2 may be used by the first channel. When the reset signal Q2 is activated immediately after the first holding signal QH0 is deactivated, the feedback capacitors CF1 and CF2 may be reset.

Similarly, when the second holding signal QH1 is activated, the scaling operation and the holding operation for the input voltages VIP1 and VIN1 that are received from the second channel and sampled may be substantially simultaneously performed by the amplifier 132a and the feedback capacitors CF1 and CF2 to generate a scaled-down sensing signal, and the feedback capacitors CF1 and CF2 may be used by the second channel. When the (M+1)-th holding signal QHM is activated, the scaling operation and the holding operation for the input voltages VIPM and VINM that are received from the (M+1)-th channel and sampled may be substantially simultaneously performed by the amplifier 132a and the feedback capacitors CF1 and CF2 to generate the scaled-down sensing signal VSENM, and the feedback capacitors CF1 and CF2 may be used by the (M+1)-th channel.

As described above, the feedback capacitors CF1 and CF2 may be shared by the plurality of channels in such a manner that the feedback capacitors CF1 and CF2 are sequentially used by the plurality of channels.

Figure 5:
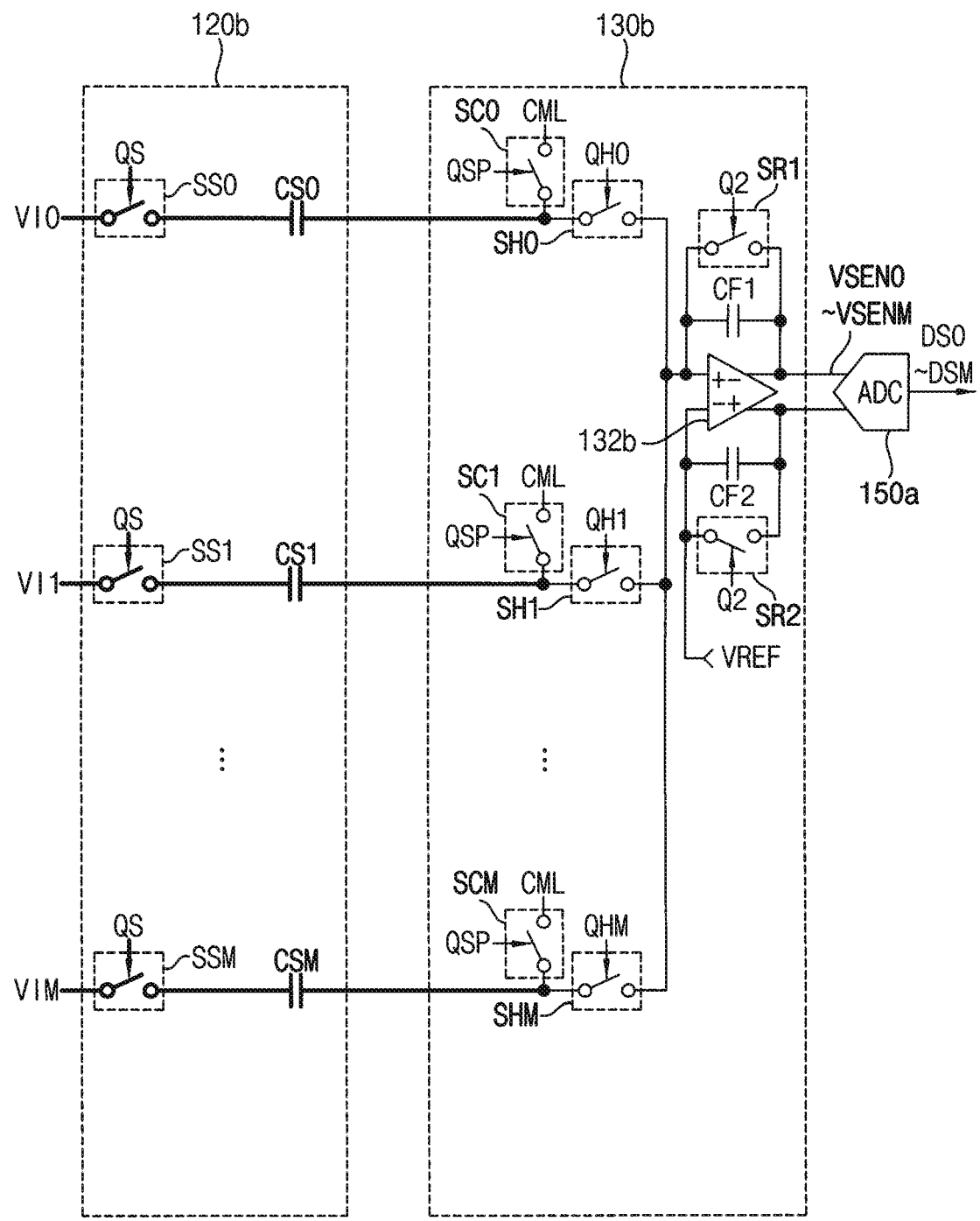
FIGS. 5 and 6 are circuit diagrams illustrating other examples of the high voltage sensing circuit of FIG. 1 according to other example embodiments.
Figure 6:
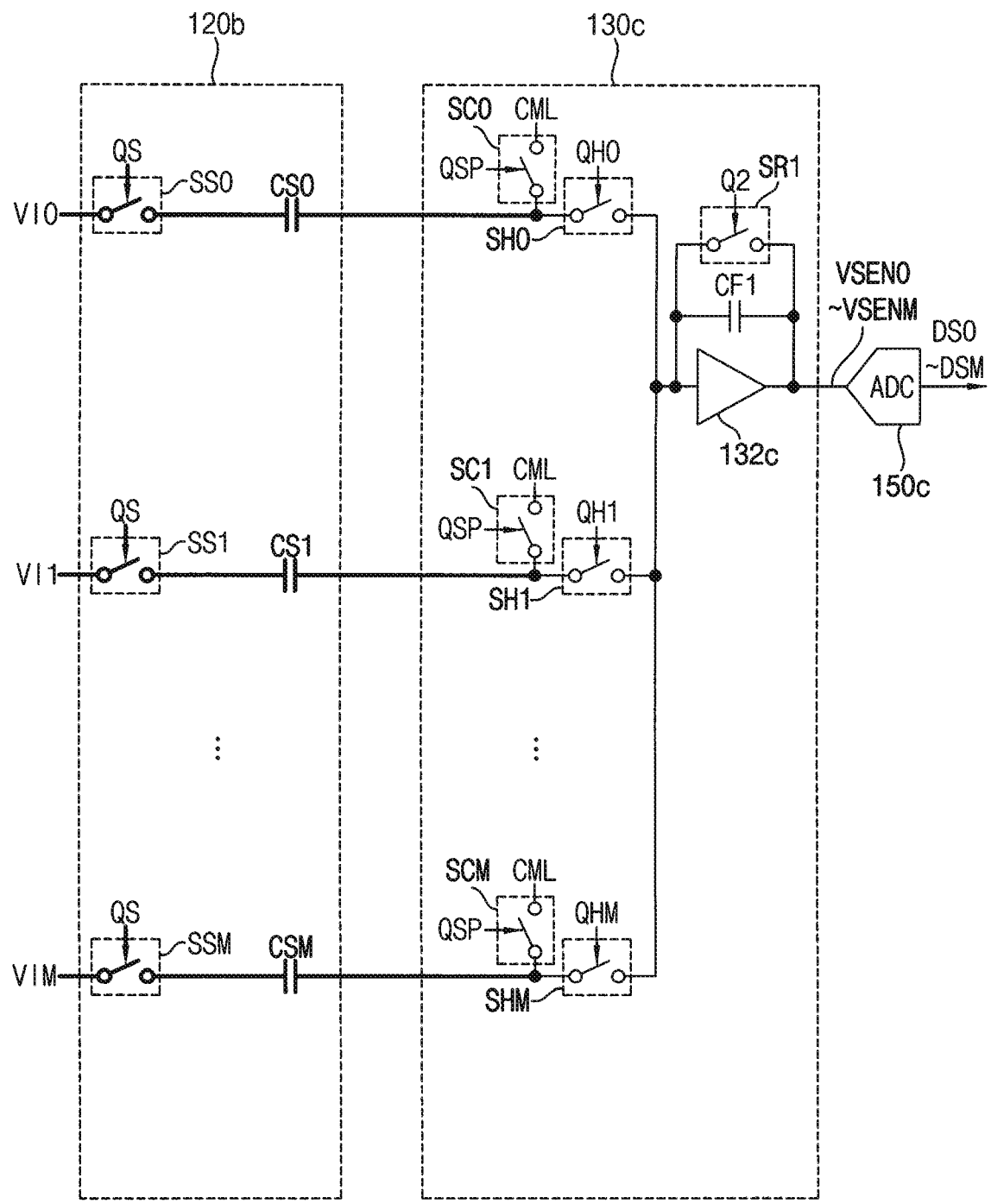

FIGS. 5 and 6 are circuit diagrams illustrating other examples of the high voltage sensing circuit of FIG. 1. The descriptions repeated with FIG. 2 will be omitted.

Referring to FIG. 5, a sampling unit 120b, a holding and scaling unit 130b, and an analog-to-digital converter 150a included in the high voltage sensing circuit 100 of FIG. 1 are illustrated in FIG. 5.

The sampling unit 120b, the holding and scaling unit 130b, and the analog-to-digital converter 150a in FIG. 5 may be substantially the same as the sampling unit 120a, the holding and scaling unit 130a, and the analog-to-digital converter 150a in FIG. 2, respectively, except that a plurality of channels in FIG. 5 are implemented in a single-ended scheme or manner rather than in the differential scheme or manner.

The sampling unit 120b may receive a plurality of input voltages VI0, VI1, . . . , VIM from the plurality of channels implemented in the single-ended scheme. The sampling unit 120b may include a plurality of sampling capacitors CS0, CS1, . . . , CSM, and may further include a plurality of sampling switches SS0, SS1, . . . , SSM.

Configurations and operations of the plurality of sampling capacitors CS0, CS1, . . . , CSM and the plurality of sampling switches SS0, SS1, . . . , SSM in FIG. 5 may be substantially the same as configurations and operations of the plurality of sampling capacitors CSP0, CSP1, . . . , CSPM and the plurality of sampling switches SSP0, SSP1, . . . , SSPM in FIG. 2, respectively.

The holding and scaling unit 130b may include an amplifier 132b, and feedback capacitors CF1 and CF2, and may further include a plurality of holding switches SH0, SH1, . . . , SHM, a plurality of common mode switches SC0, SC1, . . . , SCM, and reset switches SR1 and SR2.

Configurations and operations of the amplifier 132b, the feedback capacitors CF1 and CF2, the plurality of holding switches SH0, SH1, . . . , SHM, a plurality of common mode switches SC0, SC1, . . . , SCM and the reset switches SR1 and SR2 in FIG. 5 may be substantially the same as configurations and operations of the amplifier 132a, the feedback capacitors CF1 and CF2, the plurality of holding switches SHP0, SHP1, . . . , SHPM, the plurality of common mode switches SCP0, SCP1, . . . , SCPM and the reset switches SR1 and SR2 in FIG. 2, respectively.

In an example of FIG. 5, the plurality of channels may be implemented in the single-ended scheme, and thus the plurality of channels and the amplifier 132b may be connected to each other in the single-ended scheme. However, since the amplifier 132b is implemented in the differential scheme, the plurality of channels may be selectively connected to a first input terminal of the amplifier 132b, and a reference voltage VREF for the differential scheme may be applied to a second input terminal of the amplifier 132b.

Referring to FIG. 6, a sampling unit 120b, a holding and scaling unit 130c, and an analog-to-digital converter 150c included in the high voltage sensing circuit 100 of FIG. 1 are illustrated in FIG. 6.

The sampling unit 120b, the holding and scaling unit 130c, and the analog-to-digital converter 150c in FIG. 6 may be substantially the same as the sampling unit 120b, the holding and scaling unit 130b, and the analog-to-digital converter 150a in FIG. 5, respectively, except that an amplifiers 132c included in the holding and scaling unit 130c and the analog-to-digital converter 150c are implemented in the single-ended scheme rather than the differential scheme.

The holding and scaling unit 130c may include the amplifier 132c, and a feedback capacitor CF1, and may further include a plurality of holding switches SH0, SH1, . . . , SHM, a plurality of common mode switches SC0, SC1, . . . , SCM, and a reset switch SR1.

The amplifier 132c in FIG. 6 may be substantially the same as the amplifier 132b in FIG. 5, except that the amplifier 132c in FIG. 6 is implemented in the single-ended scheme. The feedback capacitor CF1 may be connected between an input terminal and an output terminal of the amplifier 132c, and the reset switch SR1 may be connected in parallel with the feedback capacitor CF1 between the input terminal and the output terminal of the amplifier 132c. Configurations and operations of the plurality of holding switches SH0, SH1, . . . , SHM and the plurality of common mode switches SC0, SC1, . . . , SCM in FIG. 6 may be substantially the same as configurations and operations of the plurality of holding switches SH0, SH1, . . . , SHM and the plurality of common mode switches SC0, SC1, . . . , SCM in FIG. 5, respectively.

The analog-to-digital converter 150c in FIG. 6 may be substantially the same as the analog-to-digital converter 150a in FIG. 5, except that the analog-to-digital converter 150c in FIG. 6 is implemented in the single-ended scheme.

In an example of FIG. 6, all of the plurality of channels, the amplifier 132c and the analog-to-digital converter 150c may be implemented in the single-ended scheme. Thus, the plurality of channels and the amplifier 132c may be connected to each other in the single-ended scheme, and the amplifier 132c and the analog-to-digital converter 150c may be connected to each other in the single-ended scheme.

The high voltage sensing circuit 100 according to example embodiments may include the feedback capacitor CF that is shared by the plurality of channels CH regardless of the number of the plurality of channels CH, and thus the high voltages received from the plurality of channels CH may be efficiently sensed or detected without increasing the number of capacitors and increasing the circuit area. As the feedback capacitor CF is commonly used by all the channels CH, only mismatching of the sampling capacitor CS needs to be considered to minimize mismatching between the channels, and thus the sensing error may be reduced and the sensing accuracy and performance may be improved. In addition, the high voltage sensing circuit 100 according to example embodiments may substantially simultaneously perform the scaling operation and the holding operation using the amplifier AMP and the feedback capacitor CF. Since the sensing operation is performed including only a two-phase operation of the sampling interval and the holding interval, the sensing speed may be improved.

The total number N1 of capacitors used in an example of FIG. 2, the total number N2 of capacitors used in an example of FIG. 5, and the total number N3 of capacitors used in an example of FIG. 6 may be expressed by Equation 2, Equation 3, and Equation 4, respectively.

$$N1=2*K*CS+2*CF \quad \text{[Equation 2]}$$

$$N2=K*CS+2*CF \quad \text{[Equation 3]}$$

$$N3=K*CS+CF \quad \text{[Equation 4]}$$

In Equation 2, Equation3, and Equation 4, K denotes the number of the plurality of channels CH.

Figure 7:
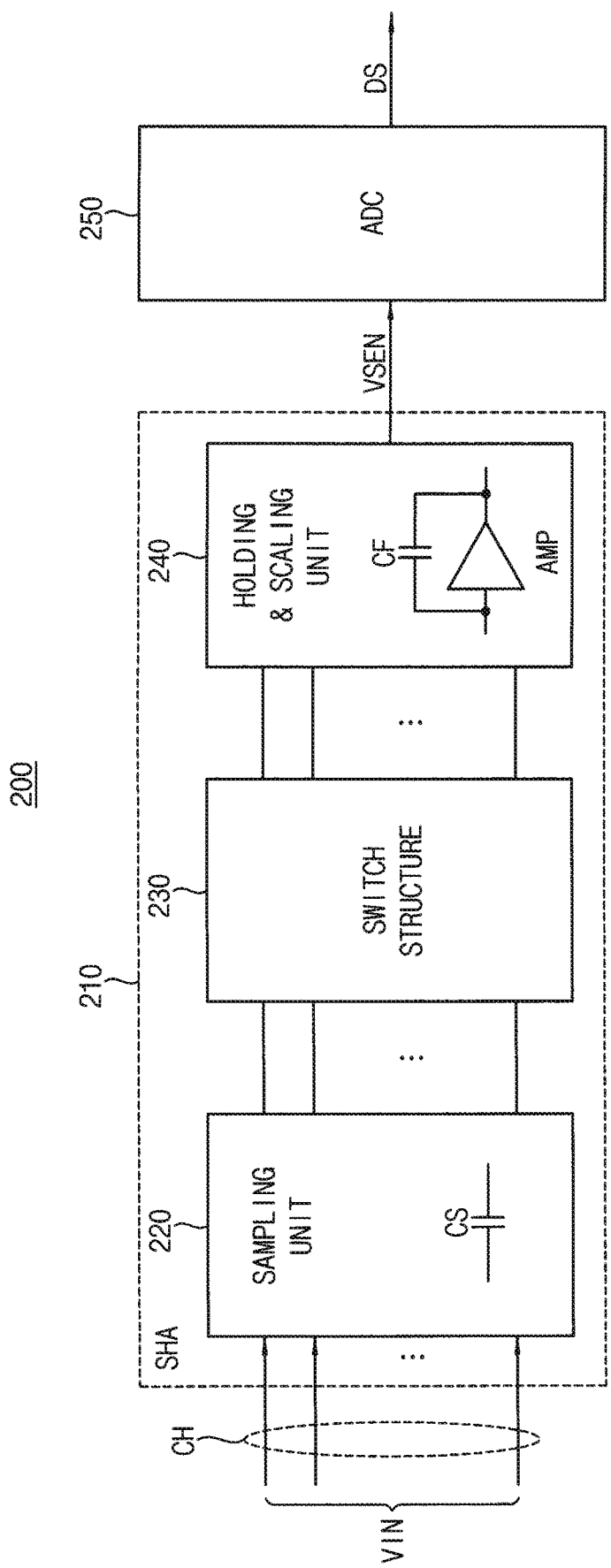
FIG. 7 is a block diagram illustrating a high voltage sensing circuit according to example embodiments.

FIG. 7 is a block diagram illustrating a high voltage sensing circuit according to example embodiments. The descriptions repeated with FIG. 1 will be omitted.

Referring to FIG. 7, a high voltage sensing circuit 200 includes a plurality of channels CH, and a sample-and-hold amplifier 210. The high voltage sensing circuit 200 may further include an analog-to-digital converter 250.

The high voltage sensing circuit 200 of FIG. 7 may be substantially the same as the high voltage sensing circuit 100 of FIG. 1, except that the sample-and-hold amplifier 210 in FIG. 7 further includes a switch structure 230.

The sample-and-hold amplifier 210 may include a sampling unit 220, and a holding and scaling unit 240, and may further include the switch structure 230.

The switch structure 230 may be disposed or located between the sampling unit 220 and the holding and scaling unit 240, and may prevent damage to elements or devices included in the holding and scaling unit 240. In other words, the switch structure 230 may be added to ensure the reliability of the holding and scaling unit 240. The switch structure 230 will be described in detail with reference to FIGS. 8, 9 and 10.

The sampling unit 220 and the holding and scaling unit 240 in FIG. 7 may be substantially the same as the sampling unit 120 and the holding and scaling unit 130 in FIG. 1, respectively. The plurality of channels CH and the analog-to-digital converter 250 in FIG. 7 may be substantially the same as the plurality of channels CH and the analog-to-digital converter 150 in FIG. 1, respectively.

Figure 8:
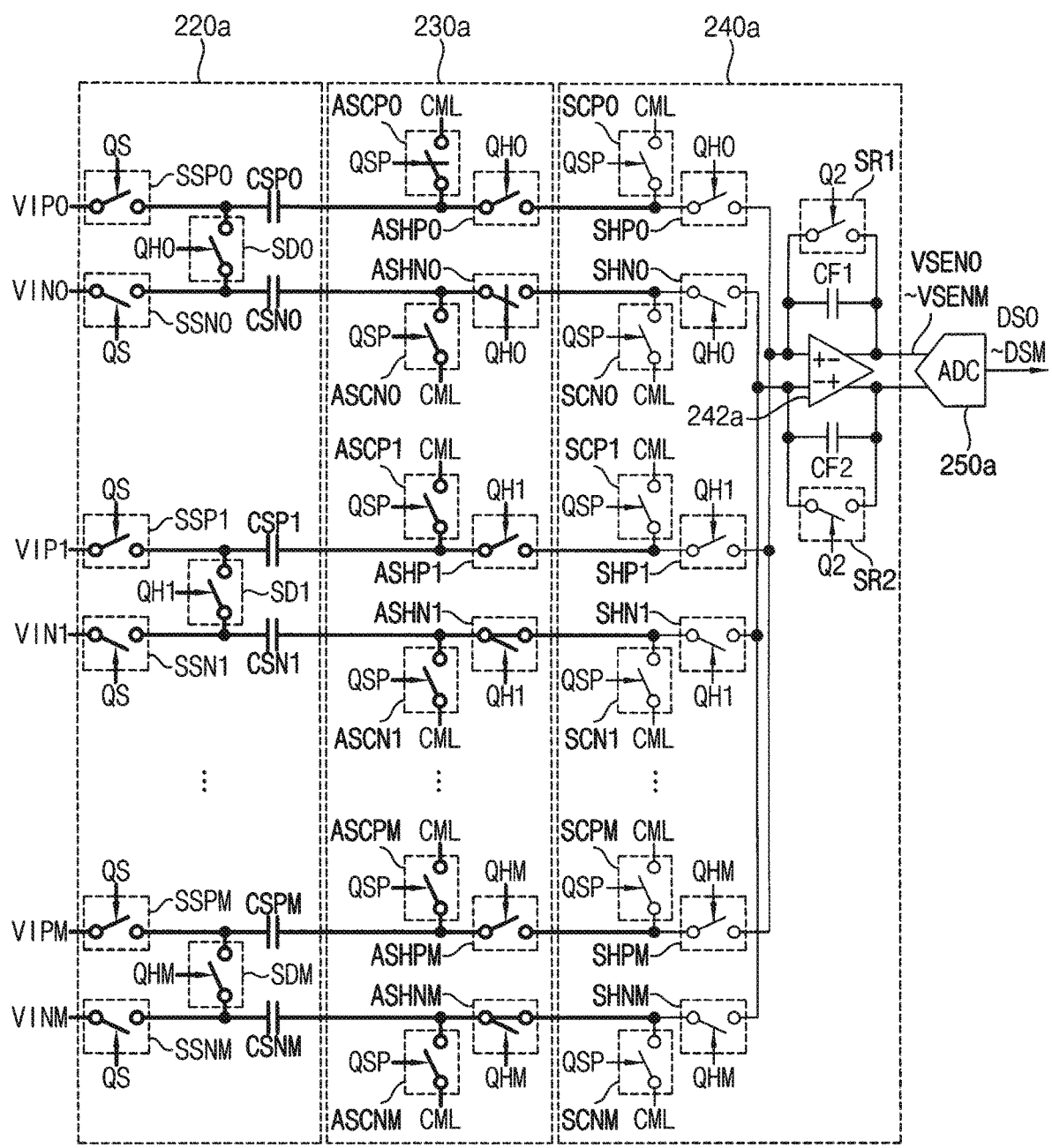
FIGS. 8, 9 and 10 are circuit diagrams illustrating other example embodiments of the high voltage sensing circuit of FIG. 7.
Figure 9:
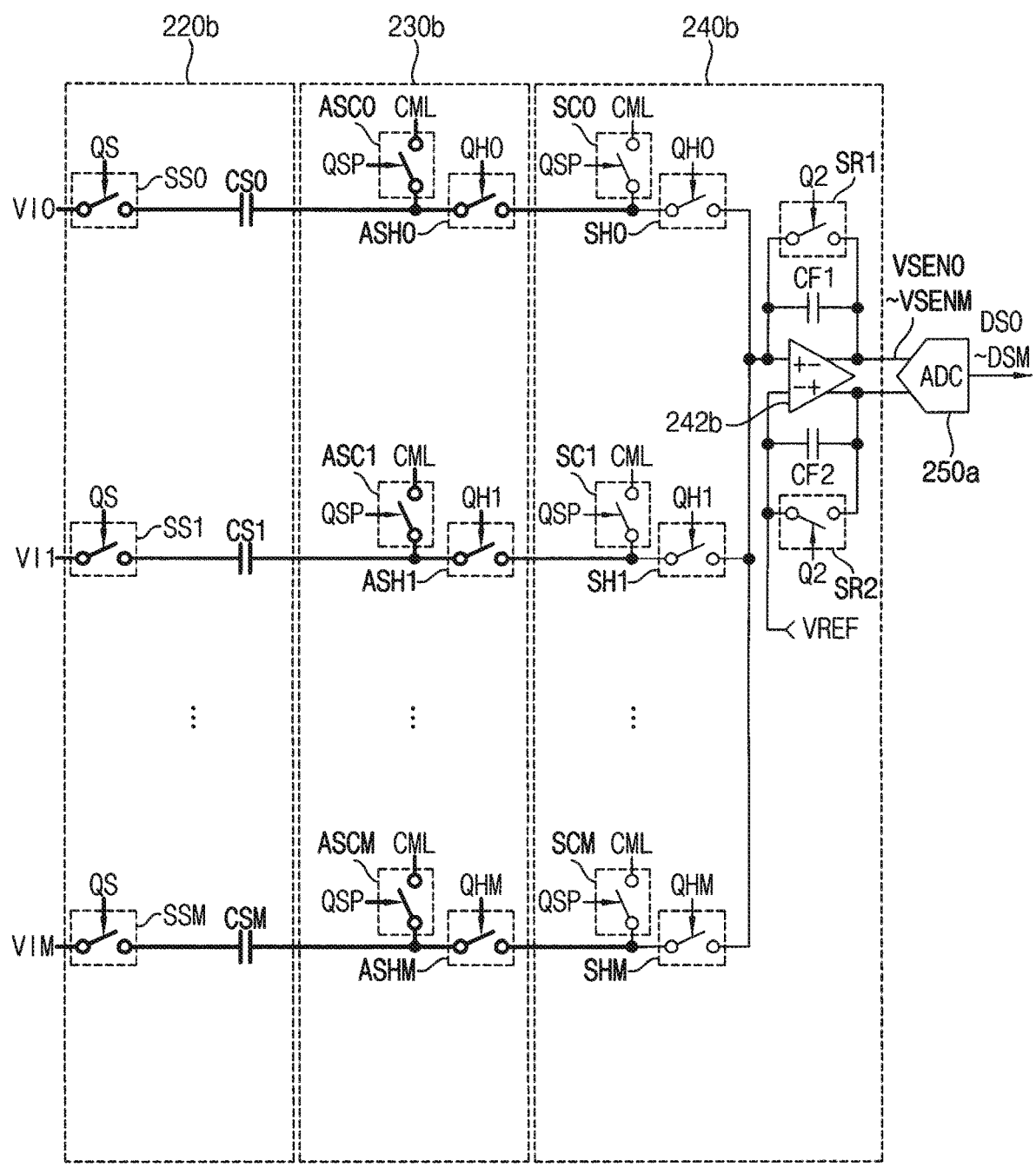
Figure 10:
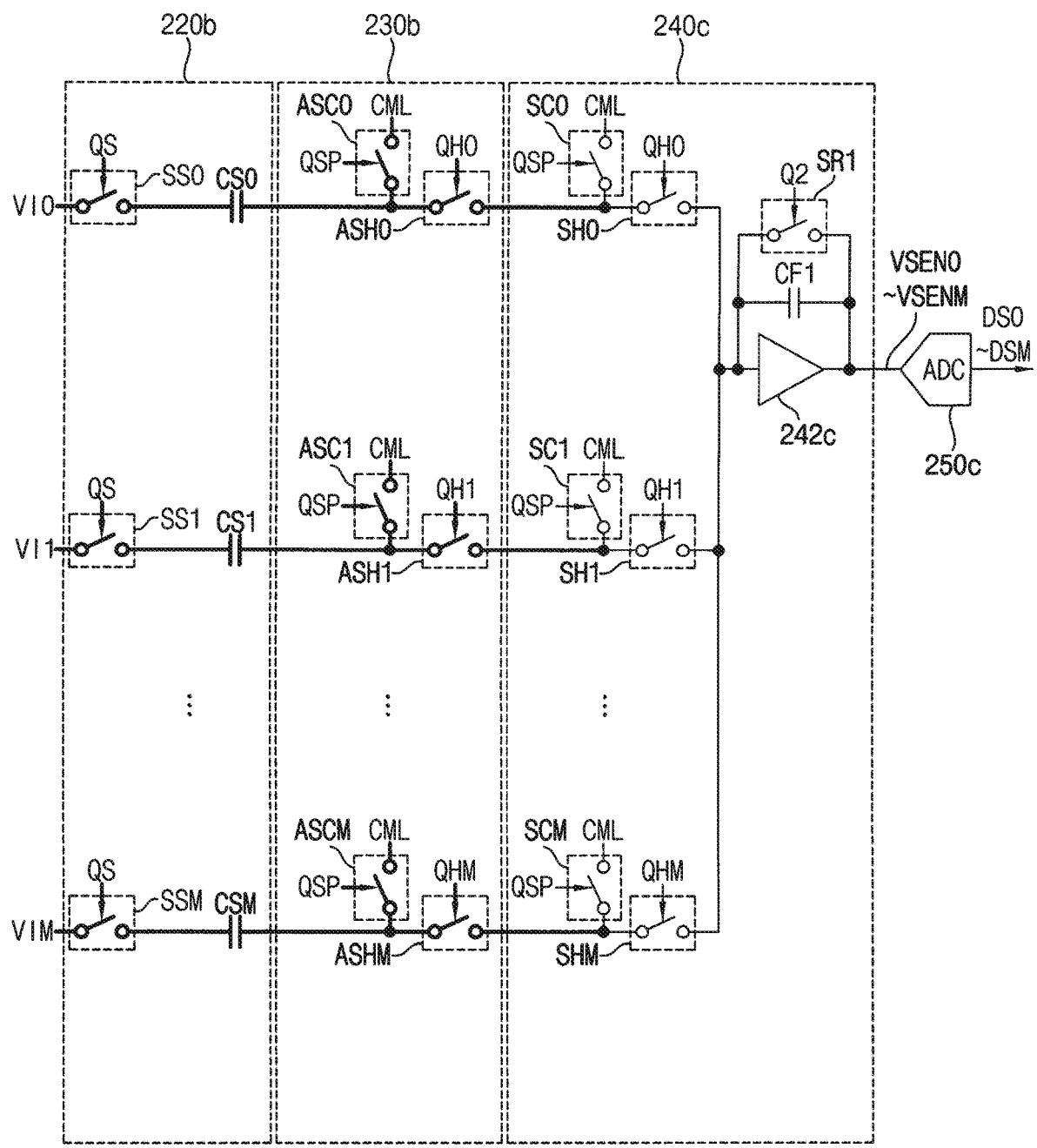

FIGS. 8, 9 and 10 are circuit diagrams illustrating examples of the high voltage sensing circuit of FIG. 7. The descriptions repeated with FIGS. 2, 5 and 6 will be omitted.

Referring to FIG. 8, a sampling unit 220a, a switch structure 230a, a holding and scaling unit 240a, and an analog-to-digital converter 250a included in the high voltage sensing circuit 200 of FIG. 7 are illustrated in FIG. 8.

The sampling unit 220a, the holding and scaling unit 240a, and the analog-to-digital converter 250a in FIG. 8 may be substantially the same as the sampling unit 120a, the holding and scaling unit 130a, and the analog-to-digital converter 150a in FIG. 2, respectively, except that the switch structure 230a is added to an example of FIG. 8.

The switch structure 230a may be disposed or located between the sampling unit 220a and the holding and scaling unit 240a, and may include a plurality of additional holding switches ASHP0, ASHN0, ASHP1, ASHN1, . . . , ASHPM and ASHNM and a plurality of additional common mode switches ASCP0, ASCN0, ASCP1, ASCN1, . . . , ASCPM and ASCNM.

The plurality of additional holding switches ASHP0, ASHN0, ASHP1, ASHN1, . . . , ASHPM and ASHNM may be disposed or located between the plurality of sampling capacitors CSP0, CSN0, CSP1, CSN1, . . . , CSPM and CSNM and the plurality of holding switches SHP0, SHN0, SHP1, SHN1, . . . , SHPM and SHNM, and may operate in response to the plurality of holding signals QH0, QH1, . . . , QHM. For example, the additional holding switches ASHP0 and ASHN0 may be disposed between the sampling capacitors CSP0 and CSN0 and the holding switches SHP0 and SHN0, and may operate in response to the first holding signal QH0. The additional holding switches ASHP1 and ASHN1 may be disposed between the sampling capacitors CSP1 and CSN1 and the holding switches SHP1 and SHN1, and may operate in response to the second holding signal QH1. The additional holding switches ASHPM and ASHNM may be disposed between the sampling capacitors CSPM and CSNM and the holding switches SHPM and SHNM, and may operate in response to the (M+1)-th holding signal QHM.

The plurality of additional common mode switches ASCP0, ASCN0, ASCP1, ASCN1, . . . , ASCPM and ASCNM may selectively connect the common mode voltage CML to nodes between the plurality of sampling capacitors CSP0, CSN0, CSP1, CSN1, . . . , CSPM and CSNM and the plurality of additional holding switches ASHP0, ASHN0, ASHP1, ASHN1, . . . , ASHPM and ASHNM in response to the second sampling signal QSP. For example, the additional common mode switches ASCP0 and ASCN0 may selectively connect the common mode voltage CML to the nodes between the sampling capacitors CSP0 and CSN0 and the additional holding switches ASHP0 and ASHN0 in response to the second sampling signal QSP. The additional common mode switches ASCP1 and ASCN1 may selectively connect the common mode voltage CML to the nodes between the sampling capacitors CSP1 and CSN1 and the additional holding switches ASHP1 and ASHN1 in response to the second sampling signal QSP. The additional common mode switches ASCPM and ASCNM may selectively connect the common mode voltage CML to the nodes between the sampling capacitors CSPM and CSNM and the additional holding switches ASHPM and ASHNM in response to the second sampling signal QSP.

In some example embodiments, configurations of the plurality of additional holding switches ASHP0, ASHN0, ASHP1, ASHN1, . . . , ASHPM and ASHNM and the plurality of additional common mode switches ASCP0, ASCN0, ASCP1, ASCN1, . . . , ASCPM and ASCNM that are included in the switch structure 230a may be substantially the same as configurations of the plurality of holding switches SHP0, SHN0, SHP1, SHN1, . . . , SHPM and SHNM and the plurality of common mode switches SCP0, SCN0, SCP1, SCN1, . . . , SCPM and SCNM that are disposed at the front end of an amplifier 242a included in the holding and scaling unit 240a. In other words, the same structure may be repeatedly arranged. Unlike the holding and scaling unit 240a that includes the elements or devices for the low voltage, the switch structure 230a may include or may be implemented with the elements or devices for the high voltage.

For example, when the plurality of input voltages VIP0, VIN0, VIP1, VIN1, . . . , VIPM and VINM which are high voltages are received in an example of FIG. 2, voltages at nodes between the plurality of sampling capacitors CSP0, CSN0, CSP1, CSN1, . . . , CSPM and CSNM and the plurality of holding switches SHP0, SHN0, SHP1, SHN1, . . . , SHPM and SHNM may instantaneously increase to such a level that the reliability of the holding and scaling unit 130a becomes damaged. However, since the plurality of additional holding switches ASHP0, ASHN0, ASHP1, ASHN1, . . . , ASHPM and ASHNM and the plurality of additional common mode switches ASCP0, ASCN0, ASCP1, ASCN1, . . . , ASCPM and ASCNM that include the elements or devices for the high voltage and have the same configurations as the plurality of holding switches SHP0, SHN0, SHP1, SHN1, . . . , SHPM and SHNM and the plurality of common mode switches SCP0, SCN0, SCP1, SCN1, . . . , SCPM and SCNM are added to an example of FIG. 8, the damage to at least one of the plurality of holding switches SHP0, SHN0, SHP1, SHN1, . . . , SHPM and SHNM, the amplifier 242a and the feedback capacitors CF1 and CF2 may be prevented, and thus the internal reliability problem may be solved.

Referring to FIG. 9, a sampling unit 220b, a switch structure 230b, a holding and scaling unit 240b, and an analog-to-digital converter 250a included in the high voltage sensing circuit 200 of FIG. 7 are illustrated in FIG. 9.

The sampling unit 220b, the holding and scaling unit 240b, and the analog-to-digital converter 250a in FIG. 9 may be substantially the same as the sampling unit 120b, the holding and scaling unit 130b, and the analog-to-digital converter 150a in FIG. 5, respectively, except that the switch structure 230b is added to an example of FIG. 9. The sampling unit 220b, the switch structure 230b, the holding and scaling unit 240b, and the analog-to-digital converter 250a in FIG. 9 may be substantially the same as the sampling unit 220a, the switch structure 230a, the holding and scaling unit 240a, and the analog-to-digital converter 250a in FIG. 8, respectively, except that a plurality of channels in FIG. 9 are implemented in the single-ended scheme rather than in the differential scheme.

The switch structure 230b may be disposed or located between the sampling unit 220b and the holding and scaling unit 240b, and may include a plurality of additional holding switches ASH0, ASH1, . . . , ASHM and a plurality of additional common mode switches ASC0, ASC1, . . . , ASCM.

Configurations and operations of the plurality of additional holding switches ASH0, ASH1, . . . , ASHM and the plurality of additional common mode switches ASC0, ASC1, . . . , ASCM in FIG. 9 may be substantially the same as configurations and operations of the plurality of additional holding switches ASHP0, ASHP1, . . . , ASHPM and the plurality of additional common mode switches ASCP0, ASCP1, . . . , ASCPM in FIG. 8, respectively.

Referring to FIG. 10, a sampling unit 220b, a switch structure 230b, a holding and scaling unit 240c, and an analog-to-digital converter 250c included in the high voltage sensing circuit 200 of FIG. 7 are illustrated in FIG. 10.

The sampling unit 220b, the holding and scaling unit 240c, and the analog-to-digital converter 250c in FIG. 10 may be substantially the same as the sampling unit 120b, the holding and scaling unit 130c, and the analog-to-digital converter 150c in FIG. 6, respectively, except that the switch structure 230b is added to an example of FIG. 10. The sampling unit 220b, the switch structure 230b, the holding and scaling unit 240c, and the analog-to-digital converter 250c in FIG. 10 may be substantially the same as the sampling unit 220b, the switch structure 230b, the holding and scaling unit 240b, and the analog-to-digital converter 250a in FIG. 9, respectively, except that an amplifiers 242c included in the holding and scaling unit 240c and the analog-to-digital converter 250c are implemented in the single-ended scheme rather than the differential scheme.

The plurality of additional holding switches ASH0, ASH1, . . . , ASHM and the plurality of additional common mode switches ASC0, ASC1, . . . , ASCM that include the elements or devices for the high voltage and have the same configurations as the plurality of holding switches SH0, SH1, . . . , SHM and the plurality of common mode switches SC0, SC1, . . . , SCM disposed at the front end of the amplifiers 242b and 242c are included in examples of FIGS. 9 and 10, and thus the internal reliability problem may be solved.

Operation timings of signals and switches in examples of FIGS. 8, 9 and 10 may be substantially the same as that described with reference to FIGS. 3 and 4.

In the high voltage sensing circuit 200 according to example embodiments, the high voltages received from the plurality of channels CH may be efficiently sensed or detected using the feedback capacitor CF without increasing the number of capacitors and increasing the circuit area. In addition, only mismatching of the sampling capacitor CS needs to be considered to minimize mismatching between the channels, and thus the sensing error may be reduced and the sensing accuracy and performance may be improved. Additionally, the sensing operation may be performed including only a two-phase operation of the sampling interval and the holding interval, and thus the sensing speed may be improved. Further, the switch structure 230 for preventing damage to the holding and scaling unit 240 which is a low voltage circuit may be added to the high voltage sensing circuit 200, and thus the high voltage sensing circuit 200 may have improved or enhanced reliability.

Figure 11:
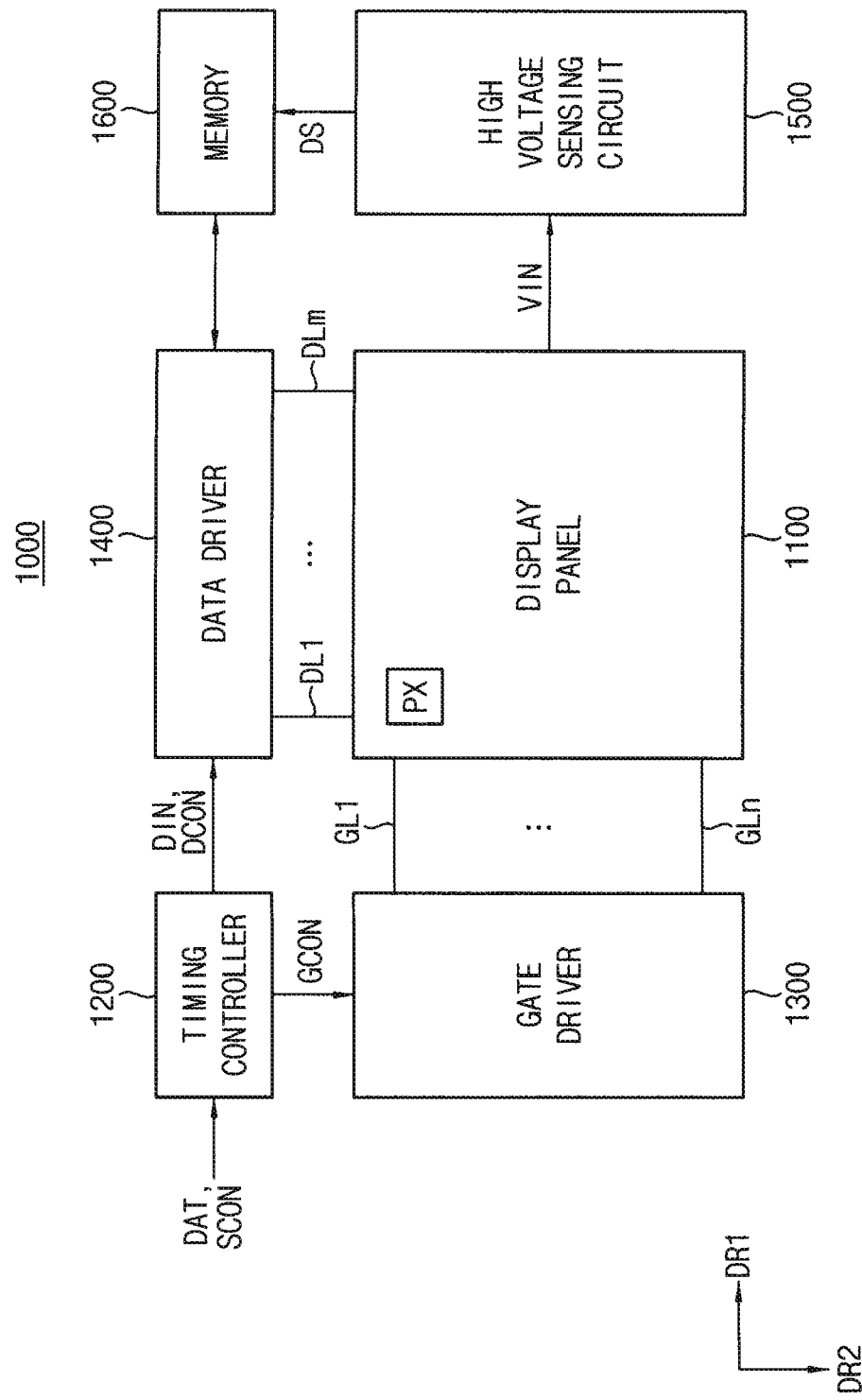
FIG. 11 is a block diagram illustrating a display apparatus including a high voltage sensing circuit according to some example embodiments.

FIG. 11 is a block diagram illustrating a display apparatus including a high voltage sensing circuit according to example embodiments.

Referring to FIG. 11, a display apparatus 1000 includes a display panel 1100, and a display driver integrated circuit (DDI) for driving the display panel 1100. The display driver integrated circuit includes a gate driver 1300, a data driver 1400, and a high voltage sensing circuit 1500. The display driver integrated circuit may further include a timing controller 1200, and a memory 1600.

The display panel 1100 operates (e.g., display an image) based on image data DIN. The display panel 1100 includes a plurality of pixels PX, a plurality of gate lines GL1~GLn, and a plurality of data lines DL1~DLm. The plurality of gate lines GL1~GLn may extend in a first direction DR1, and the plurality of data lines DL1~DLm may extend in a second direction DR2 crossing (e.g., substantially perpendicular to) the first direction DR1. Each of the plurality of pixels PX may be electrically connected to a respective one of the plurality of the gate lines GL1~GLn and a respective one of the plurality of the data lines DL1~DLm. The display panel 1100 may include a display region and a peripheral region. The plurality of pixels PX may be disposed or arranged in the display region, and the peripheral region may surround the display region. The plurality of pixels PX may be arranged in a matrix to form a pixel array.

In some example embodiments, the display panel 1100 may include one of various types of display panels such as a liquid crystal display (LCD) panel, a light emitting diode (LED) panel, an organic LED (OLED) panel, a field emission display (FED) panel, or the like.

The timing controller 1200 controls overall operations of the display apparatus 1000. The timing controller 1200 receives a data signal DAT and a system control signal SCON from an external device (e.g., a host or a graphic processor). The data signal DAT may include a plurality of pixel data for the plurality of pixels PX. The system control signal SCON may include a master clock signal, a data enable signal, a vertical synchronization signal, a horizontal synchronization signal, etc. The timing controller 1200 may be implemented within the display apparatus 1000 as hardware or software or in the form of a combination of hardware and software.

The timing controller 1200 generates the image data DIN based on the data signal DAT. The timing controller 1200 generates a gate driver control signal GCON for controlling the gate driver 1300 and a data driver control signal DCON for controlling the data driver 1400 based on the system control signal SCON. The gate driver 1300 may be implemented within the display apparatus 1000 as hardware or software or in the form of a combination of hardware and software.

The gate driver 1300 selectively enables the plurality of gate lines GL1~GLn of the display panel 1100 based on the gate driver control signal GCON to select a row of the pixel array. The data driver 1400 applies a plurality of driving voltages to the plurality of data lines DL1~DLm of the display panel 1100 based on the data driver control signal DCON and the image data DIN. The display panel 1100 may be driven by the gate driver 1300 and the data driver 1400. An image corresponding to the data signal DAT and the image data DIN may be displayed on the display panel 1100. The data driver 1400 may be implemented within the display apparatus 1000 as hardware or software or in the form of a combination of hardware and software.

The high voltage sensing circuit 1500 senses or detects a plurality of input voltages VIN provided from the display panel 1100, and outputs a plurality of digital signals DS indicating a sensing result. The high voltage sensing circuit 1500 may form an analog front-end (AFE), and may be the high voltage sensing circuit according to example embodiments described with reference to FIGS. 1 through 10. For example, the high voltage sensing circuit 1500 may include the feedback capacitor CF that is shared by the plurality of channels CH, and thus the high voltages received from the plurality of channels CH may be efficiently sensed or detected without increasing the number of capacitors and increasing the circuit area. In addition, the sensing operation may be performed including only a two-phase operation of the sampling interval and the holding interval, and thus the sensing speed may be improved. Further, the switch structure 230 for preventing damage to a low voltage circuit may be added to the high voltage sensing circuit 1500, and thus the high voltage sensing circuit 1500 may have improved or enhanced reliability.

The memory 1600 may store the sensing result based on the plurality of digital signals DS. The sensing result may be provided to the data driver 1400 and may be used to drive the display panel 1100.

In some example embodiments, the memory 1600 may include at least one of various volatile memories such as a dynamic random access memory (DRAM), a static random access memory (SRAM), or the like, and/or at least one of various nonvolatile memories such as a flash memory, a phase change random access memory (PRAM), a resistance random access memory (RRAM), a magnetic random access memory (MRAM), a ferroelectric random access memory (FRAM), a nano floating gate memory (NFGM), a polymer random access memory (PoRAM), or the like.

According to example embodiments, all the elements (e.g., the timing controller 1200, the gate driver 1300, the data driver 1400, the high voltage sensing circuit 1500, and the memory 1600) included in the display driving integrated circuit may be implemented as one chip, or the timing controller 1200 and the other elements (e.g., the gate driver 1300, the data driver 1400, the high voltage sensing circuit 1500, and the memory 1600) may be implemented as separate chips.

Figure 12:
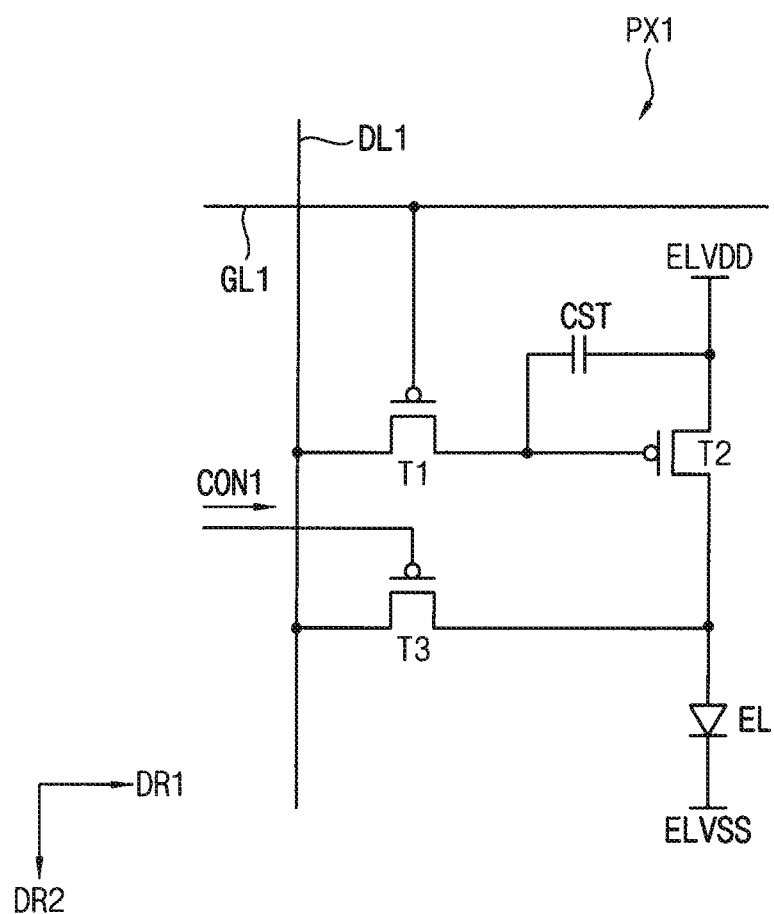
FIG. 12 is a circuit diagram illustrating an example of a pixel included in a display apparatus according to some example embodiments.

FIG. 12 is a circuit diagram illustrating an example of a pixel included in a display apparatus according to example embodiments.

Referring to FIG. 12, a pixel PX1 may be connected to a gate line GL1 and a data line DL1, and may include an organic light emitting diode EL, a capacitor CST, and a plurality of transistors T1, T2 and T3.

The transistor T1 may receive a data signal via the data line DL1, and may transmit the data signal to the transistor T2. The transistor T2 may supply a driving current corresponding to the data signal provided via the transistor T1 to the organic light emitting diode EL. The capacitor CST may be connected between a gate electrode of the transistor T2 and one end of the transistor T2 to which a power supply voltage ELVDD is applied, and may maintain an ON state of the transistor T2 for one frame such that the organic light emitting diode EL maintains a light emitting state for one frame. The organic light emitting diode EL may be connected between the other end of the transistor T2 and a ground voltage ELVSS.

The organic light emitting diode EL may be degraded or deteriorated with the passage of usage time, and a threshold voltage of the organic light emitting diode EL may be changed. Therefore, even if the same driving current is supplied to the organic light emitting diode EL, the brightness may be changed and the color of the screen may be changed. Accordingly, it is required for a system that periodically senses or detects the threshold voltage of the organic light emitting diode EL and supplies an appropriate or optimized driving current.

For example, after the display apparatus 1000 is powered on and before the image is displayed on the display panel 1100, or in a threshold voltage sensing mode, a control signal CON1 may be supplied and the transistor T3 may be turned on in response to the control signal CON1. The threshold voltage of the organic light emitting diode EL may be sensed or detected via the data line DL1.

In some example embodiments, the high voltage sensing circuit 1500 according to example embodiments may be used for sensing or detecting the threshold voltage of the organic light emitting diode EL. In other words, each of the plurality of input voltages VIN that is provided from the display panel 1100 to the high voltage sensing circuit 1500 may be the threshold voltage of the organic light emitting diode EL.

As described above, after sensing the threshold voltage of the organic light emitting diode EL and storing a threshold value indicating the threshold voltage in the memory 1600, the data signal may be compensated by considering a change in the threshold voltage (e.g., a difference between an original threshold voltage and a current threshold voltage) with reference to the threshold value stored in the memory 1600, and may be output to the organic light emitting diode EL in an image display mode in which the image is displayed on the display panel 1100. Thus, the organic light emitting diode EL may emit light at a constant brightness regardless of the change in the threshold voltage.

Although an example of the pixel PX1 included in the display panel 1100 is illustrated in FIG. 12, example embodiments are not limited thereto. For example, the pixel structure may be changed according to example embodiments.

Although an example where the display panel 1100 is an OLED panel including the organic light emitting diode EL and the threshold voltage of the organic light emitting diode EL is sensed using the high voltage sensing circuit 1500, example embodiments are not limited thereto. For example, the display panel 1100 may be one of various types of display panels such as a LCD panel, an OLED panel, a FED panel, or the like, and the high voltage sensing circuit 1500 may be used to sense at least one of various types of high voltages used in the display panel 1100 or used to drive the display panel 1100.

Figure 13:
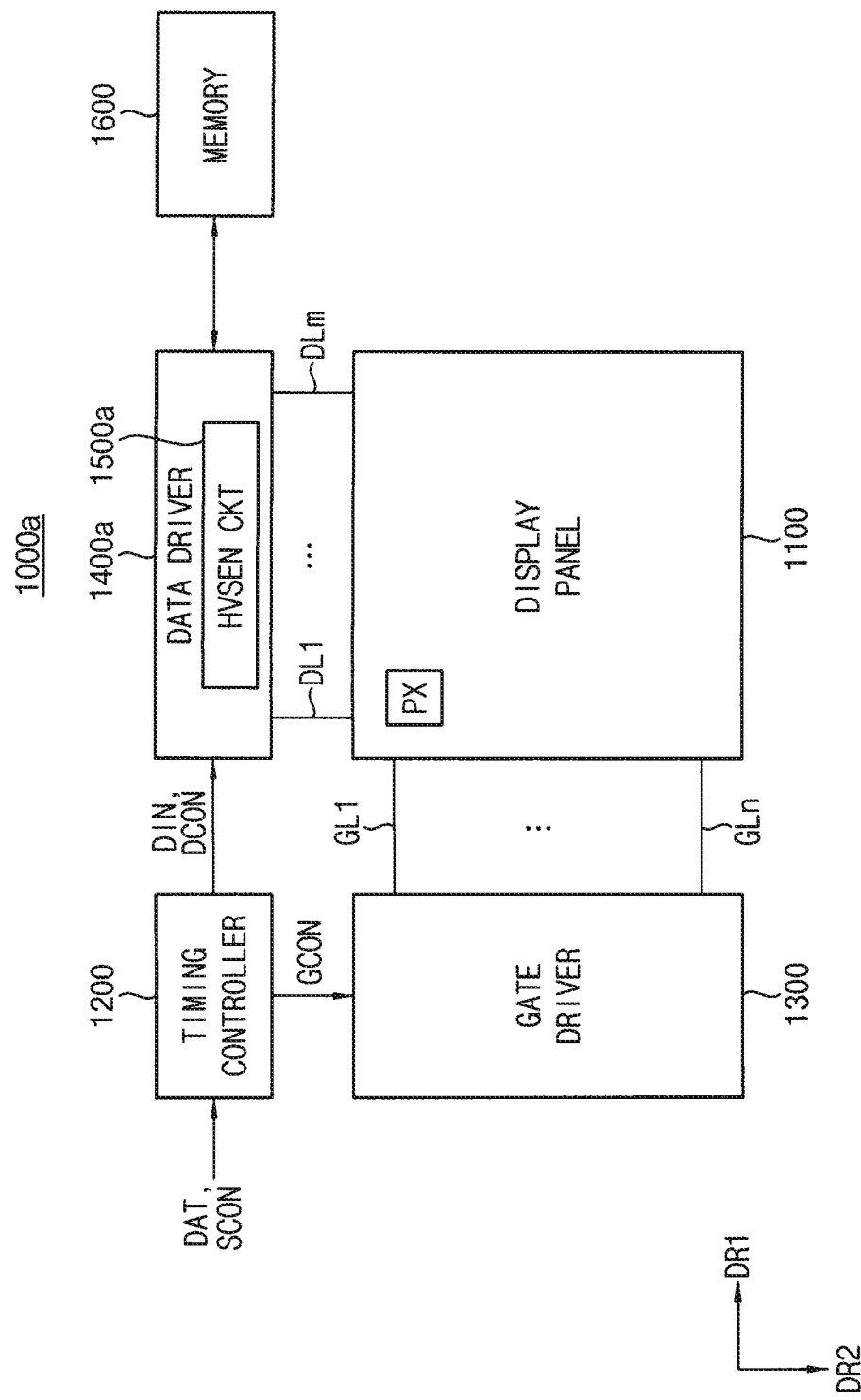
FIG. 13 is a block diagram illustrating a display apparatus including a high voltage sensing circuit according to some example embodiments.

FIG. 13 is a block diagram illustrating a display apparatus including a high voltage sensing circuit according to example embodiments. The descriptions repeated with FIG. 11 will be omitted.

Referring to FIG. 13, a display apparatus 1000a includes a display panel 1100, and a display driver integrated circuit. The display driver integrated circuit includes a gate driver 1300, a data driver 1400a, and a high voltage sensing circuit 1500a. The display driver integrated circuit may further include a timing controller 1200, and a memory 1600.

The display apparatus 1000a of FIG. 13 may be substantially the same as the display apparatus 1000 of FIG. 1, except that the high voltage sensing circuit 1500a is disposed or located in the data driver 1400a in FIG. 13.

As described with reference to FIG. 12, when the threshold voltage of the organic light emitting diode EL is sensed via the data line DL1 and/or when at least one of various types of high voltages used in the display panel 1100 or used to drive the display panel 1100 is sensed via the data line DL1, the high voltage sensing circuit 1500a may be included in the data driver 1400a.

The data driver 1400a may generate and/or provide the first sampling signal QS, plurality of holding signals QH0, QH1, . . . QHM, second sampling signal QSP, and reset signal Q2 to the high voltage sensing circuit 1500a.

Although not illustrated in FIGS. 11 and 13, when at least one of various types of high voltages used in the display panel 1100 or used to drive the display panel 1100 is sensed via the gate line, the high voltage sensing circuit may be included in the gate driver 1300.

Figure 14:
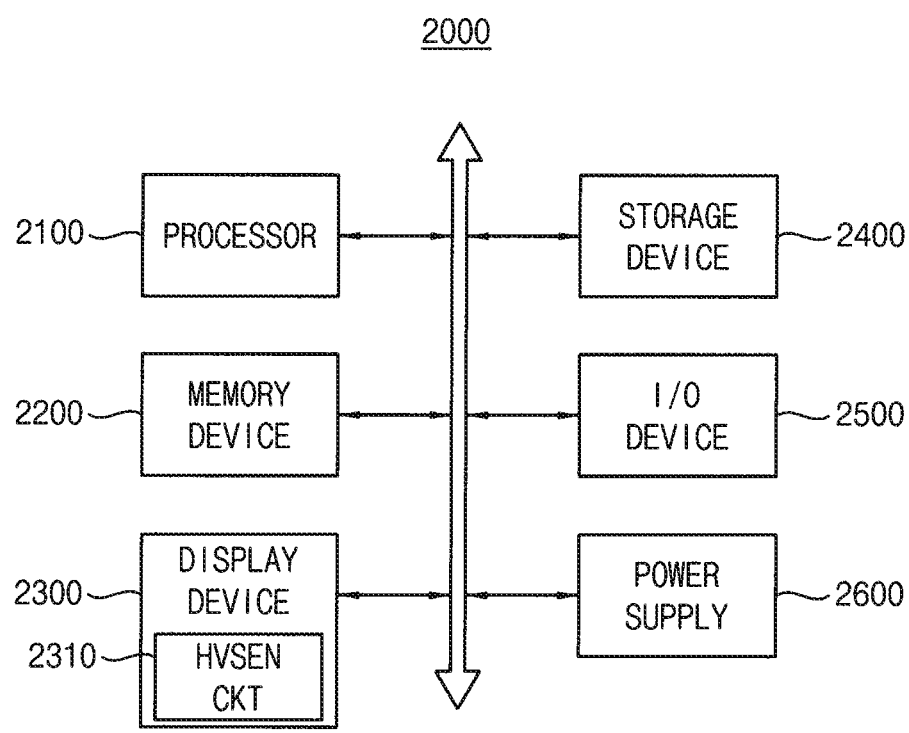
FIG. 14 is a block diagram illustrating an electronic system including a high voltage sensing circuit according to some example embodiments.

FIG. 14 is a block diagram illustrating an electronic system including a high voltage sensing circuit according to example embodiments.

Referring to FIG. 14, an electronic system 2000 may include a processor 2100, a memory device 2200, a display device 2300, a storage device 2400, an input/output (I/O) device 2500, and a power supply 2600.

The processor 2100 may perform various computing functions or tasks. The processor 2100 may be connected to the memory device 2200, the display device 2300, the storage device 2400, and the I/O device 2500 via a bus such as an address bus, a control bus, a data bus, etc.

The memory device 2200 and the storage device 2400 may store data for operations of the electronic system 2000. The I/O device 2500 may include input devices such as a keyboard, a keypad, a mouse, etc, and output devices such as a printer, etc. The power supply 2600 may provide a power for operations of the electronic system 2000.

The display device 2300 may display an image, and may be the display apparatus described with reference to FIGS. 11 through 13. The display device 2300 may include a high voltage sensing circuit 2310 according to example embodiments. Thus, various high voltages used in driving may be efficiently sensed, and reliability characteristics and performance may be improved.

The inventive concept may be applied to various electronic devices and systems including the display apparatus and system. For example, the inventive concept may be applied to systems such as a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A high voltage sensing circuit included in a display driver integrated circuit, comprising:
    a plurality of channels configured to receive a plurality of input voltages, respectively;
    a plurality of sampling capacitors connected to the plurality of channels, respectively, to simultaneously sample respective ones of the plurality of input voltages;
    an amplifier configured to sequentially receive each of a plurality of sampled input voltages to sequentially generate a respective plurality of sensing voltages, each of the respective plurality of sensing voltages being lower than a respective one of the plurality of input voltages;
    a feedback capacitor connected between an input terminal and an output terminal of the amplifier, and shared by the plurality of channels;
    a plurality of sampling switches, each of the plurality of sampling switches between one of the plurality of channels and the respective one of the plurality of sampling capacitors, and configured to operate in response to a first sampling signal; and
    a plurality of holding switches, each of the plurality of holding switches between one of the plurality of sampling capacitors and the amplifier, and configured to operate in response to one of a plurality of holding signals,
    wherein the amplifier and the feedback capacitor are configured such that each of the plurality of sampled input voltages is sequentially scaled to the respective one of the plurality of sensing voltages by the amplifier and the feedback capacitor,
    wherein the plurality of sampling switches include switching elements for a high voltage, and the plurality of holding switches include switching elements for a low voltage.

2. The high voltage sensing circuit of claim 1, wherein:
    the plurality of sampling switches are configured such that when the first sampling signal is received by the plurality of sampling switches during a sampling interval, the plurality of input voltages are simultaneously sampled by the sampling switches, and
    the plurality of holding switches are configured such that when the plurality of holding signals are sequentially received during a holding interval, each of the plurality of sampled input voltages is sequentially scaled to the respective one of the plurality of sensing voltages and then the plurality of sensing voltages are sequentially provided, the plurality of sampled input voltages being sequentially scaled and the plurality of sensing voltages being sequentially provided simultaneously.

3. The high voltage sensing circuit of claim 1, further comprising:
    a plurality of common mode switches configured to selectively connect a common mode voltage to respective nodes between each of the plurality of sampling capacitors and the respective one of the plurality of holding switches in response to a second sampling signal.

4. The high voltage sensing circuit of claim 3, wherein the second sampling signal is activated simultaneously with the first sampling signal and is deactivated prior to the first sampling signal.

5. The high voltage sensing circuit of claim 1, further comprising:
    a switch structure disposed between the each of the plurality of sampling capacitors and the respective ones of the plurality of holding switches, and configured to prevent damage to at least one of the plurality of holding switches, the amplifier, and the feedback capacitor.

6. The high voltage sensing circuit of claim 5, wherein the switch structure includes:
    a plurality of additional holding switches disposed between two of the plurality of sampling capacitors and the respective ones of the plurality of holding switches, and configured to operate in response to the plurality of holding signals; and
    a plurality of additional common mode switches, each one of the plurality of additional common mode switched configured to selectively connect a common mode voltage to a node between one of the plurality of sampling capacitors and the respective one of the plurality of additional holding switches in response to a second sampling signal.

7. The high voltage sensing circuit of claim 6, wherein the plurality of additional holding switches and the plurality of additional common mode switches include switching elements for the high voltage.

8. The high voltage sensing circuit of claim 1, further comprising:
    a reset switch connected in parallel with the feedback capacitor between the input terminal and the output terminal of the amplifier, and configured to operate in response to a reset signal.

9. The high voltage sensing circuit of claim 1, wherein the plurality of channels and the amplifier are connected to each other in a differential scheme.

10. The high voltage sensing circuit of claim 1, wherein the plurality of channels and the amplifier are connected to each other in a single-ended scheme.

11. The high voltage sensing circuit of claim 1, further comprising:
    an analog-to-digital converter configured to convert the plurality of sensing voltages into a plurality of digital signals.

12. The high voltage sensing circuit of claim 11, wherein the amplifier and the analog-to-digital converter are connected to each other in a differential scheme.

13. The high voltage sensing circuit of claim 11, wherein the amplifier and the analog-to-digital converter are connected to each other in a single-ended scheme.

14. A high voltage sensing circuit included in a display driver integrated circuit, comprising:
    a plurality of channels;
    a plurality of sampling capacitors connected to the plurality of channels, respectively;
    an amplifier including an input terminal connected to the plurality of sampling capacitors, and an output terminal;
    a feedback capacitor connected between the input terminal and the output terminal of the amplifier;
    a plurality of sampling switches, each of the plurality of sampling switches between one of the plurality of channels and a respective one of the plurality of sampling capacitors; and a plurality of holding switches, each of the plurality of holding switches between one of the plurality of sampling capacitors and the input terminal of the amplifier,
wherein the plurality of sampling switches include switching elements for a high voltage, and the plurality of holding switches include switching elements for a low voltage.

15. The high voltage sensing circuit of claim 14, further comprising:
a plurality of common mode switches, each of the plurality of common mode switches between one of the plurality of sampling capacitors and a respective one of the plurality of holding switches.

16. The high voltage sensing circuit of claim 14, further comprising:
a switch structure disposed between the each of the plurality of sampling capacitors and a respective one of the plurality of holding switches.

17. The high voltage sensing circuit of claim 16, wherein the switch structure includes:
a plurality of additional holding switches, each of the plurality of additional holding switches between one of the plurality of sampling capacitors and the respective one of the plurality of holding switches; and
a plurality of additional common mode switches, each of the plurality of additional common mode between one of the plurality of sampling capacitors and the respective one of the plurality of additional holding switches.

18. A method of operating a high voltage sensing circuit included in a display driver integrated circuit, the method comprising:
receiving, by a plurality of channels, a plurality of input voltages;
simultaneously sampling, by a plurality of sampling switches and a plurality of sampling capacitors, the plurality of input voltages in response to a first sampling signal; and
sequentially receiving, by a plurality of holding switches, an amplifier and a feedback capacitor, each of a plurality of sampled input voltages in response to one of a plurality of holding signals to sequentially generate a plurality of sensing voltages,
wherein each of the plurality of sensing voltages is lower than a respective one of the plurality of input voltages,
wherein each of the plurality of sampled input voltages is sequentially scaled to a respective one of the plurality of sensing voltages, and
wherein the plurality of sampling switches include switching elements for a high voltage, and the plurality of holding switches include switching elements for a low voltage.

\* \* \* \* \*